(12) United States Patent
Oba

(10) Patent No.: US 7,711,395 B2
(45) Date of Patent: May 4, 2010

(54) CIRCUIT CURRENT GENERATION APPARATUS AND METHOD THEREOF, AND SIGNAL PROCESSING APPARATUS

(75) Inventor: Yasuo Oba, Shiga (JP)

(73) Assignee: Panasonic Corporation, Osaka (JP)

( * ) Notice: Subject to any disclaimer, the term of this patent is extended or adjusted under 35 U.S.C. 154(b) by 792 days.

(21) Appl. No.: 11/498,584

(22) Filed: Aug. 3, 2006

(65) Prior Publication Data

US 2007/0032215 A1 Feb. 8, 2007

(30) Foreign Application Priority Data

Aug. 3, 2005 (JP) ............................. 2005-224891

(51) Int. Cl.
  *H04B 1/04* (2006.01)
(52) U.S. Cl. ................. 455/574; 455/127.1; 455/127.5; 455/343.1
(58) Field of Classification Search ................. 455/574, 455/127.1, 127.5, 343.1, 13.4, 522, 550.1, 455/572, 343.2
See application file for complete search history.

(56) References Cited

U.S. PATENT DOCUMENTS

| 5,349,285 | A | 9/1994 | Okanobu |
| 6,339,711 | B1* | 1/2002 | Otaka et al. ............... 455/550.1 |
| 6,434,373 | B2* | 8/2002 | Ichihara .................... 455/127.5 |
| 7,095,994 | B1* | 8/2006 | Aytur et al. ............... 455/234.1 |
| 7,289,778 | B2* | 10/2007 | Sasaki ........................ 455/127.5 |
| 7,493,149 | B1* | 2/2009 | Doyle et al. ................. 455/574 |
| 2005/0143045 | A1* | 6/2005 | Jiguet et al. .............. 455/343.1 |
| 2006/0194554 | A1* | 8/2006 | Tsividis .................... 455/226.2 |
| 2007/0202932 | A1* | 8/2007 | Keller ......................... 455/574 |

FOREIGN PATENT DOCUMENTS

| JP | 5-315861 A | 11/1993 |
| JP | 9-107299 A | 4/1997 |

* cited by examiner

*Primary Examiner*—Pablo N Tran
(74) *Attorney, Agent, or Firm*—RatnerPrestia

(57) ABSTRACT

A semiconductor integrated circuit for use in a receiver can reduce fluctuations in characteristics caused by fluctuations in current to thereby reduce dissipation power. A bias current detection circuit and a current control circuit are provided to decrease a current of a high-frequency circuit if a bias current is large and, if the bias current is small, increase the current of the high-frequency circuit, so as to prevent characteristics of the high-frequency circuit from deteriorating and to reduce the current, thereby enabling reducing dissipation power.

9 Claims, 15 Drawing Sheets

CIRCUIT CURRENT GENERATION APPARATUS AND METHOD THEREOF, AND SIGNAL PROCESSING APPARATUS

BACKGROUND OF THE INVENTION

1. Field of Invention

The present invention relates to an apparatus for correcting fluctuations in current through a semiconductor circuit so that its dissipation power can be reduced and, more specifically, technologies of a circuit current generation apparatus and method thereof, and a signal processing apparatus.

2. Description of Related Art

Recently, portable devices represented by portable telephones have come to be mounted with a variety of receivers, so that it has been required to greatly reduce power dissipated by the receivers. For example, some receivers used in analog TV sets conventionally dissipate power in excess of several hundreds milliwatt to one watt and so are not qualified for use in portable devices driven by batteries. However, digital TV sets for portable use to appear aftertime are required for a great cutback in dissipation power than ever; receivers thereof are required to have dissipation power of 100 mW or less.

To meet these requirements, circuits that constitute the receiver are mostly incorporated into a semiconductor integrated circuit, so that dissipation power of the semiconductor integrated circuit (hereinafter abbreviated as IC) determines that of the receiver.

However, manufacturing processes for an IC fluctuate significantly to fluctuate dissipation power of the IC by at least ±20% in some cases, so that a ratio between a maximum value and a minimum value of its current may become at least 1.5. Circuit performance of the receiver depends largely on high-frequency circuits. Further, a current value of the high-frequency circuits is larger than that of other bias circuits and low-frequency circuits; each of transistors thereof may require several milliamperes or more in some cases. Therefore, by reducing a current of the high-frequency circuit, dissipation power can be reduced effectively. Moreover, characteristics of the high-frequency circuit depend on a value of current through the circuit in many cases; in particular, an oscillation circuit in a local oscillator etc. may encounter a fatal problem of disruption of oscillation caused by a reduction in current. Therefore, how much a current can be reduced is limited by a value of a lowest current due to current fluctuations, thus constituting one of problems to be solved in reduction of dissipation power. Therefore, suppressing fluctuations in current is one of the important conditions for lower dissipation power.

Conventionally, a current value of a high-frequency circuit has been set with a sufficient margin for the purpose of prioritizing characteristics of the circuit, so that if the current value was too high, dissipation power of the circuit has been reduced to prevent a rise in temperature. For example, Japanese Patent Application Laid Open Publication No. Hei 9-107299 discloses taking countermeasures against a rise in dissipation current switchover temperature through a reception electric field. However, currently no measure is taken to solve deterioration in characteristics caused by fluctuations in current owing to fluctuations in manufacturing of an IC.

To solve these problems, a conventional method reduces a current of a high-frequency circuit itself and so has a problem of a deterioration in characteristics at a lowest current owing to current fluctuations as described above, which current fluctuations constitute an obstacle against a reduction in dissipation power of an IC because of a necessity to secure a margin for the current fluctuations.

Further, by reducing fluctuations in the processes and screening components in manufacturing processes, current fluctuations can be reduced, which approach, however, has a problem of increased costs and deteriorated productivity.

SUMMARY OF THE INVENTION

To solve these problems, a first aspect of the present invention is a signal processing apparatus including a reception section which is connected to an antenna circuit operable to receive a broadcast signal having a desired frequency in order to convert the broadcast signal into a predetermined intermediate-frequency signal or baseband signal, a current detection section operable to detect a bias current flowing in the reception section, and a current control circuit operable to control the bias current of a high-frequency circuit in the reception section in accordance with an output of the current detection section.

According to the first aspect of the present invention, it is possible to detect a magnitude of a bias current value in an IC and, if the current is less than a center value and so characteristics of the high-frequency circuit are deteriorated, increase a current of this high-frequency circuit to prevent the deterioration in characteristics. On the other hand, if the current is larger than the center value, the current of that high-frequency circuit can be reduced to provide the signal processing apparatus capable of reducing dissipation power.

A second aspect of the present invention is a signal processing apparatus including a mixer which is connected to an antenna circuit operable to receive a broadcast signal having a desired frequency in order to convert the broadcast signal into a predetermined intermediate-frequency signal or baseband signal, a local oscillator operable to generate a signal having a frequency corresponding to the broadcast signal, a buffer circuit operable to receive an output of the local oscillator to supply a local oscillation signal to the mixer, a frequency divider operable to divide a frequency of an output of the local oscillator, a PLL circuit operable to operate in response to an output of the frequency divider so that the local oscillator output may have a predetermined frequency, an intermediate-frequency signal processing section operable to receive an output of the mixer to process the intermediate-frequency signal or the baseband signal, a reference current source operable to supply a constant current to the mixer, the local oscillator, the frequency divider, the PLL circuit, and the intermediate-frequency signal processing section, a bias current detection section operable to detect a current value of the reference current source, and a current control circuit operable to control current values of the mixer, the local oscillator, the frequency divider, the PLL circuit, and the intermediate-frequency signal processing section in accordance with an output of the bias current detection section.

According to the second aspect of the present invention, it is possible to detect a magnitude of a bias current value in an IC and, if the current is less than a center value and so characteristics of a high-frequency circuit such as the mixer, the local oscillator, the buffer circuit, the frequency divider, and the PLL circuit are deteriorated, increase a current of these blocks to prevent the deterioration in characteristics. On the other hand, if the current is larger than a designed value, the current of these blocks can be reduced to provide the signal processing apparatus capable of reducing dissipation power.

A third aspect of the present invention is the signal processing apparatus according to the first or second aspect of the present invention including first and second current sources generated by a reference voltage source and a first resistor, a second resistor which is connected to the first current source and has a structure equal to that of the first resistor, and a third resistor which is connected to the second current source, wherein a difference between voltages generated through the second and third resistors respectively is detected to detect a bias current value in the signal processing apparatus.

According to the third aspect of the present invention, by using a resistor having a high absolute accuracy, for example, a high-accuracy resistor outside an IC as the third resistor, voltages generated through the internal and external resistors respectively can be detected to detect a current value in the IC, thereby adjusting a current of the high-frequency circuit to provide the signal processing apparatus capable of reducing dissipation power.

A fourth aspect of the present invention is the signal processing apparatus according to the first or second aspect of the present invention including a first resistor arranged between a first reference voltage source and a second reference voltage source, and a second resistor through which a current equal to that flowing through the first resistor flows and of which one electrode is connected to the second reference voltage source, wherein a difference between voltages generated at both ends of the first and second resistors respectively is detected to detect a bias current value in the signal processing apparatus.

According to the fourth aspect of the present invention, by using a resistor having a high absolute accuracy, for example, a high-accuracy resistor outside an IC as the second resistor, voltages generated through the internal and external resistors respectively can be detected to detect a current value in the IC, thereby adjusting a current of the high-frequency circuit to provide the signal processing apparatus capable of reducing dissipation power.

A fifth aspect of the present invention is the signal processing apparatus according to the first or second feature of the present invention, wherein by current control by the current control circuit, if a bias current value is small, a current of an emitter follower is increased, and if the bias current value is large, the current of the emitter follower is decreased.

According to the fifth aspect of the present invention, if a current value of the emitter follower is small, the current can be increased to improve frequency characteristics as the buffer circuit so that high-frequency characteristics may be secured even if a current of other circuits is decreased, while the current can be reduced if the current is large without significantly deteriorating the frequency characteristics, thereby providing the signal processing apparatus capable of reducing dissipation power.

A sixth aspect of the present invention is the signal processing apparatus according to the first or second feature of the present invention, wherein by current control by the current control circuit, if a bias current value is small, a current of a source follower is increased, and if the bias current value is large, the current of the source follower is decreased.

According to the sixth aspect of the present invention, if a current value of the source follower is small, the current can be increased to improve frequency characteristics as the buffer circuit so that high-frequency characteristics may be secured even if a current of other circuits is decreased, while the current can be reduced if the current is large without significantly deteriorating the frequency characteristics, thereby providing the signal processing apparatus capable of reducing dissipation power.

A seventh aspect of the present invention is the signal processing apparatus according to the first or second feature of the present invention, wherein by current control by the current control circuit, if a bias current value is small, a current of the local oscillator is increased, and if the bias current value is large, the current of the local oscillator is decreased.

According to the seventh aspect of the present invention, if a current value of the local oscillator is small, the current can be increased to flow so that the local oscillator may not stop even if a current of other circuits is decreased, while the current can be reduced if the current is large without significantly deteriorating the characteristics, thereby providing the signal processing apparatus capable of reducing dissipation power.

An eighth aspect of the present invention is the signal processing apparatus according to the second feature of the present invention, wherein by current control by the current control circuit, if a bias current value is small, a current of the mixer is increased, and if the bias current value is large, the current of the mixer is decreased.

According to the eighth aspect of the present invention, if a current value of the mixer is decreased to narrow an input dynamic range, the current can be increased to expand the input dynamic range, and if the current is large, the current can be reduced in such a range that the input dynamic range may be tolerated, thereby providing the signal processing apparatus capable of reducing dissipation power.

A ninth aspect of the present invention is the signal processing apparatus according to the first or second feature of the present invention, wherein by current control by the current control circuit, if a bias current value is small, a current of a differential amplifier is increased, and if the bias current value is large, the current of the differential amplifier is decreased.

According to the ninth aspect of the present invention, if a current value of the differential amplifier is decreased to decrease a gain, the current is increased to increase the gain, and if the current is large, the current can be reduced in such a range that the gain may be tolerated, thereby providing the signal processing apparatus capable of reducing dissipation power and fluctuations in gain.

A tenth aspect of the present invention is the signal processing apparatus according to the second feature of the present invention including a switch circuit at an output terminal of the current control circuit, wherein in accordance with an output of the current control circuit, the switch circuit conducts current control by switching a current of the mixer, the local oscillator, the frequency divider, the PLL circuit, and the intermediate-frequency signal processing section.

According to the tenth aspect of the present invention, if a current value of a high-frequency block is decreased to deteriorate its characteristics, a transfer switch provided can switch a resistance value or the circuit even if the current value cannot be easily changed, thereby providing the signal processing apparatus capable of reducing dissipation power.

An eleventh aspect of the present invention is a circuit current generation apparatus at least partially constituted of a semiconductor integrated circuit, operable to generate a circuit current, the circuit current generation apparatus including a reference voltage source operable to generate a predetermined reference voltage, reference current generation device operable to generate first and second reference currents which are roughly equal to each other based on the reference voltage, voltage detection device operable to detect a first voltage generated when the first reference current flows and a second voltage generated when the second reference current flows, correction current generation device operable to generate a correction current based on the first and second voltages, and circuit current output device operable to output the circuit current based on the correction current.

A twelfth aspect of the present invention is a signal processing apparatus at least partially constituted of a semiconductor integrated circuit, including a circuit current generation apparatus operable to generate a circuit current and a circuit current operation section operating based on the circuit current, wherein the circuit current generation apparatus including a reference voltage source operable to generate a predetermined reference voltage, reference current generation device operable to generate first and second reference currents which are roughly equal to each other based on the reference voltage, voltage detection device operable to detect a first voltage generated when the first reference current flows and a second voltage generated when the second reference current flows, correction current generation device operable to generate a correction current based on the first and second voltages, and circuit current output device operable to output the circuit current based on the correction current, and the circuit current output device is arranged in the circuit current operation section.

A thirteenth aspect of the present invention is a circuit current generation method operable to generate a circuit current, the method including a step of generating a predetermined reference voltage, a step of generating first and second reference currents which are roughly equal to each other based on the reference voltage, a step of detecting a first voltage generated when the first reference current flows and a second voltage generated when the second reference current flows, a step of generating a correction current based on the first and second voltages, and a step of outputting the circuit current based on the correction current.

According to the present invention, by providing a conventional integrated circuit with a bias current detection section and a current control circuit, it is possible to configure a signal processing apparatus that can detect fluctuations in current which are unavoidable because of production of the IC and, if a current value of a high-frequency circuit is small, increase the current of the high-frequency circuit, and if the current is large, decrease the current of the high-frequency circuit to suppress the fluctuations in current, thereby reducing dissipation power.

According to the present invention, by providing a conventional integrated circuit with a bias current detection section and a current control circuit, it is possible to configure a signal processing apparatus that can detect fluctuations in current which are unavoidable because of production of the IC and, if a current value of a high-frequency circuit is small, increase the current of the high-frequency circuit, and if the current is large, decrease the current of the high-frequency circuit to suppress the fluctuations in current, thereby reducing dissipation power.

According to the present invention, it is possible to configure a signal processing apparatus that can detect fluctuations in bias current based on a difference in voltage generated by causing a bias current in an IC to flow through an internal resistor and an external high-accuracy resistor of the IC, decrease a current of each high-frequency circuit if the current value is large, and increase the current if small, by using a current control circuit, so that high-frequency characteristics may be improved, to improve the fluctuations in current, thereby reducing dissipation power.

According to the present invention, it is possible to configure a signal processing apparatus that can detect fluctuations in bias current based on a difference in voltage generated by causing a bias current in an IC to flow through an internal resistor and an external high-accuracy resistor of the IC, decrease a current of each high-frequency circuit if the current value is large, and increase the current if small, by using a current control circuit, so that high-frequency characteristics may be improved, to improve the fluctuations in current, thereby reducing dissipation power.

According to the present invention, by providing a conventional integrated circuit with a bias current detection section and a current control circuit, it is possible to configure a signal processing apparatus that can control a current of an emitter follower in a high-frequency circuit, thereby reducing power.

According to the present invention, by providing a conventional integrated circuit with a bias current detection section and a current control circuit, it is possible to configure a signal processing apparatus that can control a current of a source follower in a high-frequency circuit, thereby reducing power.

According to the present invention, by providing a conventional integrated circuit with a bias current detection section and a current control circuit, it is possible to configure a signal processing apparatus that can control a current of a local oscillation circuit, thereby reducing power.

According to the present invention, by providing a conventional integrated circuit with a bias current detection section and a current control circuit, it is possible to configure a signal processing apparatus that can control a current of a mixer, thereby reducing power.

According to the present invention, by providing a conventional integrated circuit with a bias current detection section and a current control circuit, it is possible to configure a signal processing apparatus that can control a current of a differential amplifier, thereby reducing power.

According to the present invention, by providing a conventional integrated circuit with a bias current detection section and a current control circuit, it is possible to configure a signal processing apparatus that can, if a current value of a high-frequency circuit is small, switch to a circuit having a larger current to increase the current of the high-frequency circuit and, if the current is large, switch to a circuit having a smaller current to decrease the current of the high-frequency circuit, to suppress fluctuations in current, thereby reducing dissipation power.

DETAILED DESCRIPTION OF THE PREFERRED EMBODIMENTS

The following will describe embodiments of the present invention with reference to drawings.

First Embodiment

Figure 1:
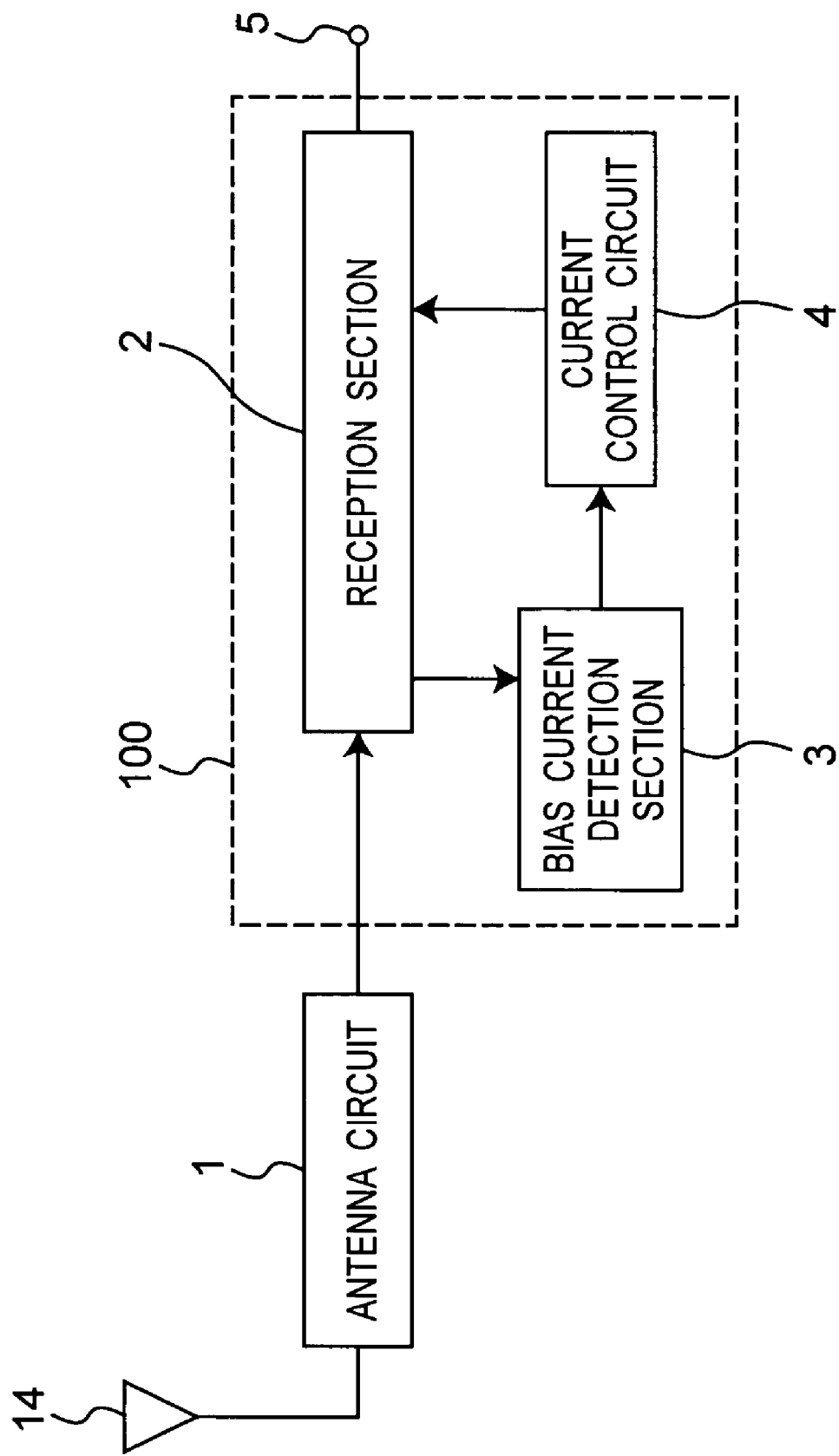
FIG. 1 is a block diagram showing a configuration of a first embodiment of the present invention.

FIG. 1 is a block diagram showing a configuration of a signal processing apparatus according to the first embodiment of the present invention. In FIG. 1, a semiconductor integrated circuit 100 of the first embodiment is comprised of a reception section 2, a bias current detection section 3, and a current control circuit 4.

An antenna circuit 1 typically includes a tuning circuit, an AGC, and an RF amplifier. However, the RF amplifier may be incorporated into the semiconductor integrated circuit 100. From an output terminal 5 of the reception section 2, a low-frequency baseband signal or an intermediate-frequency signal is output.

The following will describe operations of the signal processing apparatus having such a configuration.

In FIG. 1, a broadcast signal input from an antenna 14 enters the antenna circuit 1 to select a desired channel therein and is amplified by the RF amplifier in the antenna circuit 1 and is input to the reception section 2. The RF amplifier typically has an AGC function as well, to operate in such a manner that an excessive input may not be provided to the semiconductor integrated circuit 100. The reception section 2 performs appropriate frequency conversion and level setting to send the input signal to the subsequent-stage signal processing section. The subsequent-stage signal processing section is not shown in FIG. 1.

The bias current detection section 3 detects an absolute value of a bias current flowing through a high-frequency circuit in the semiconductor integrated circuit 100. A signal thus detected operates in such a manner as to increase, by using a current control circuit 4, a current value of the high-frequency circuit in the reception section 2 if the current is small and so characteristics are insufficient, and, if the current value is large, decrease the current value in such a range that a deterioration in characteristics can be tolerated.

Second Embodiment

The following will describe the second embodiment of the present invention.

Figure 2:
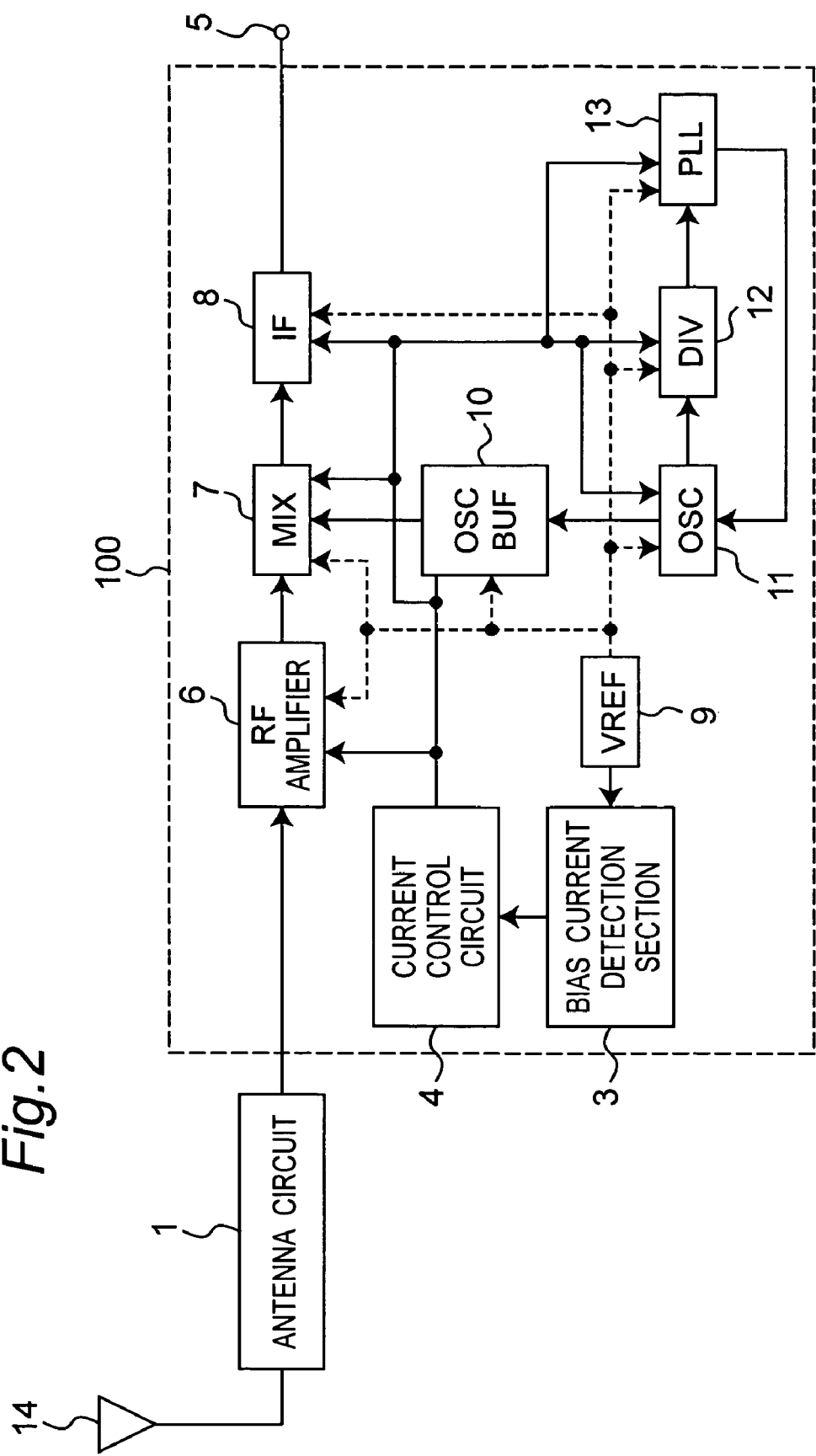
FIG. 2 is a block diagram showing a configuration of a second embodiment of the present invention.

FIG. 2 is a detailed block diagram showing a circuit current generation apparatus according to a second embodiment of the present invention. In FIG. 2, the same components as those of FIG. 1 are indicated by the same numerals.

An RF amplifier 6 is arranged in a semiconductor integrated circuit 100 of FIG. 2 but may be placed outside the circuit 100 in some cases. Furthermore, the circuit 100 comprises a mixer 7, an intermediate-frequency signal processing section 8, a buffer circuit 10 for performing level adjustment etc. for the purpose of inputting an output of a local oscillator to the mixer, the local oscillator 11, a frequency divider 12 for dividing a frequency of output of the local oscillator, a PLL circuit 13 for causing the local oscillator to oscillate at a predetermined frequency, a reference power source circuit 9, a bias current detection section 3, and a current control circuit 4.

The following will describe operations of a signal processing apparatus of the second embodiment having such a configuration.

In FIG. 2, a broadcast signal input from an antenna 14 enters an antenna circuit 1 to select a desired channel therein and is input to the semiconductor integrated circuit 100. The received signal thus input is amplified by an RF amplifier 6 and, under the control of an AGC function typically, operates in such a manner that an excess input may not be applied to subsequent stages. The mixer (MIX) 7 performs appropriate frequency conversion and level setting to send the input signal to the subsequent-stage intermediate-frequency signal processing section (IF) 8. The intermediate-frequency signal processing section 8 passes the input signal through a predetermined band pass filter to convert it into a baseband signal and inputs it to a subsequent-stage video signal/audio signal processing section. The subsequent-stage video signal/audio signal processing section is not shown in FIG. 2.

On the other hand, the local oscillator (OSC) 11, the frequency divider (DIV) 12, and the PLL circuit 13 operate in such a manner as to oscillate a local oscillation frequency that corresponds to a received channel; the local oscillator 11 outputs a signal having a difference frequency between a frequency of the received signal and an intermediate frequency, which signal is converted by the buffer circuit (OSCBUF) 10 into an oscillation signal level appropriate for the mixer 7 and is input to the mixer 7 to be multiplied with the received signal, and to output an intermediate-frequency signal or a baseband signal from a terminal 5.

The reference power source (VREF) 9 is a power source circuit for supplying a constant voltage to each block in the semiconductor integrated circuit 100, so that the bias current detection section 3 detects a bias current. If this bias current is large, the current control circuit 4 operates in such a manner as to decrease a current for each block, and if the bias current is small, the current control circuit 4 operates in such a manner as to increase a current for each block.

In this semiconductor integrated circuit 100, the RF amplifier 6, the mixer 7, the local oscillator 11, the frequency divider 12, the local oscillation buffer circuit 10, and even the intermediate-frequency signal processing section 8 in some cases typically handle a high frequency. Therefore, a bias current value increases depending on the frequency, and greatly depends on the current in terms of characteristics as well. This is because a high-frequency circuit increases a current by decreasing a value of a resistance employed internally in order to suppress an influence by a parasitic capacity inside the semiconductor integrated circuit 100. Therefore, characteristics such as a gain, a noise factor (NF), and a dynamic range which are important in a receiver typically tend to become better as the current becomes larger.

Therefore, power dissipated in the semiconductor integrated circuit 100 is predominantly accounted for by dissipation power of this high-frequency circuit, so that a decrease in current of the high-frequency circuit is one of effective solutions to reduce the dissipation power. It is to be noted that although a decrease in power source voltage also reduces dissipation power, in a portable device, which uses a battery as its power source in many cases, dissipation power cannot always be reduced efficiently taking into account an adverse effect of a drop in voltage of the battery. Therefore, a decrease in dissipation current value itself is by far effective in reducing dissipation power.

An obstacle against this reduction in current is fluctuations in current value which occur in production of the semiconductor integrated circuit 100. The current typically fluctuates by about 15-20% owing to fluctuations in resistance value, current amplification factor (Hfe) of transistors, etc. Taking into account performance of a receiver, it is necessary to secure proper characteristics when the current fluctuations are minimized, not to speak of the case of a center value of the fluctuations. Therefore, a bias current value is set with a design margin on a minimum value of current fluctuations, so that an increase in power of at least 20% with respect to the center value must be allowed for. Therefore, to reduce dissipation power, countermeasures against current fluctuations are required in addition to suppression of the center value. Although the countermeasures may seem to be unnecessary because dissipation power decreases if the current decreases, taking measures in case of a decrease in current value is also required because performance also deteriorates in such a case as described above.

In the signal processing apparatus according to the second embodiment of the present invention, a bias current is detected, and if a bias current value is large, the bias current value can be decreased, and if the value is small, the bias current value can be increased, so that it is possible to secure proper characteristics of the high-frequency circuit in addition to suppression of current fluctuations.

Third Embodiment

The following will describe a third embodiment of the present invention.

Figure 3:
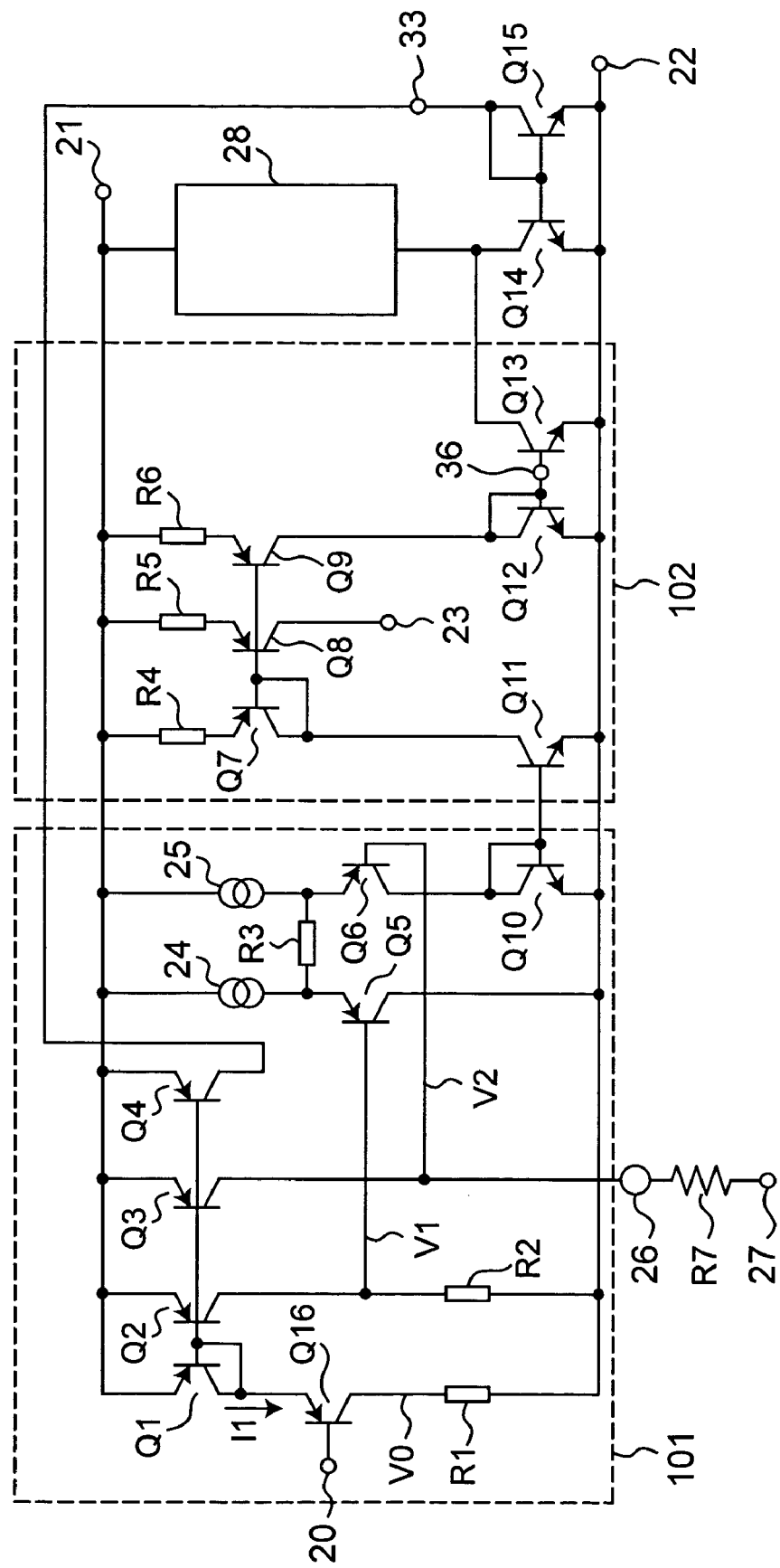
FIG. 3 is a circuit diagram showing a configuration of a third embodiment of the present invention.

FIG. 3 is a diagram showing a specific circuit configuration of a bias current detection section and a current control circuit which are used in a circuit current generation apparatus of the present invention.

In FIG. 3, Q1, Q2, Q3, and Q4 indicate transistors that constitute a current mirror, Q5 and Q6 indicate transistors that constitute a differential amplifier, Q7, Q8, and Q9 indicate transistors that constitute a current mirror, Q12, Q13, Q14, and Q15 indicate transistors that constitute a current mirror similarly, R1 R2, R3, R4, R5 and R6 indicate resistors, R7 indicates a resistor having a high absolute accuracy outside an IC, 24 and 25 indicate constant current sources, 26 indicates a terminal of the IC, 21 indicates a terminal of a power source, 22 indicates an earth terminal, 28 indicates a high-frequency circuit, 23 indicates a current output terminal, and 20 indicates a constant voltage terminal which is provided inside or outside the IC. 101 and 102 indicate a bias current detection section and a current control circuit respectively.

In FIG. 3, emitter voltage V0 of Q16 drops from constant voltage 20 by a base-emitter voltage of Q16 to provide a roughly constant voltage. A current obtained by dividing an emitter voltage of Q16 by a resistance R1 flows as a collector current of Q1. Since Q2, Q3 and Q4 constitute the current mirror in combination with Q1 and, therefore, have the same collector current. Therefore, base voltage V1 of Q5 becomes (R2*I1) and base voltage V2 of Q6 becomes (R7*I1). An input voltage of the differential amplifier constituted of Q5 and Q6 is given by the following equation.

$$V1-V2=R2*I1-R7*I1$$

where (I1=V0/R1), so that (V1-V2) is given by the following equation.

$$V1-V2=(R2/R1)*V0-(R7/R1)*V0$$

Thinking of a case where a resistance in the semiconductor integrated circuit fluctuates, the first term (R2/R1) on the right side of this equation is configured in the same semiconductor integrated circuit and so has a low relative fluctuation and hence an almost constant ratio thereof. On the other hand, the second term (R7/R1) on the right side has a ratio of a different type of resistances, so that by using a high absolute-accuracy resistor, R7 has a value proportional to (1/R1) and (V1−V2) has a difference in voltage corresponding to fluctuations in current in the semiconductor integrated circuit. Fluctuations in bias current in the semiconductor integrated circuit are caused by a plurality of factors, among which fluctuations in resistance value configured inside the circuit constitute the most significant actor, so that such a configuration as that according to the present invention is effective in detection of a bias current.

It is to be noted that if no fluctuations occur when a center value of R2 is set equal to R7, (V1−V2=0) is established.

Next, if R1 is larger than the center value, I1 becomes smaller than the center value, wherein case (V1−V2>0) is established. On the other hand, if R1 is smaller than the center value, I1 becomes larger than the center value, wherein case (V1−V2<0) is established. This value of (V1−V2) is converted into a current by the differential amplifier constituted of Q5 and Q6, which current passes through the current mirror circuit constituted of Q10 and Q11, so that an output given by detecting fluctuations in bias current value is output as a collector current of Q11.

Next, the collector current of Q11 flows through the current mirror circuit constituted of Q7, Q8, and Q9, and collector currents of Q8 and Q9 flow corresponding to fluctuations in current value. As can be seen from the above description, if the current value is larger than a center value, (V1−V2<0) is established, so that the collector current of Q11 becomes smaller than a center value, and if the current value is smaller than the center value, (V1−V2>0), so that the collector current of Q11 becomes larger than the center value.

A collector current of Q4 is supplied to the high-frequency circuit 28 by the current mirror circuit constituted of Q14 and Q15. Further, a collector current of Q9 is supplied to the high-frequency circuit 28 by the current mirror circuit constituted of Q12 and Q13. According to the above description, a collector current of Q13 becomes small if a current of Q14 is larger than a center value and becomes large if the current of Q14 is smaller than the center value. Therefore, a current of the high-frequency circuit 28 is corrected by the collector current of Q13 even if an original base current or the collector current of Q14 increases or decreases. How much it is corrected is determined by changing an emitter resistance of the differential amplifier or a ratio among R4, R5, and R6

If there is a circuit to be corrected other than the high-frequency circuit 28, it can be corrected by supplying it with a correction current by using such a current mirror circuit as that of Q8. It is to be noted that although a bias circuit of the high-frequency circuit 28 is constituted of the same current mirror circuit as that of the bias current detection section 101, a bias source of the high-frequency circuit may be constituted of any other current source because fundamentally a resistance value in the semiconductor integrated circuit has relatively low fluctuations.

Fourth Embodiment

The following will describe the fourth embodiment of the present invention.

Figure 4:
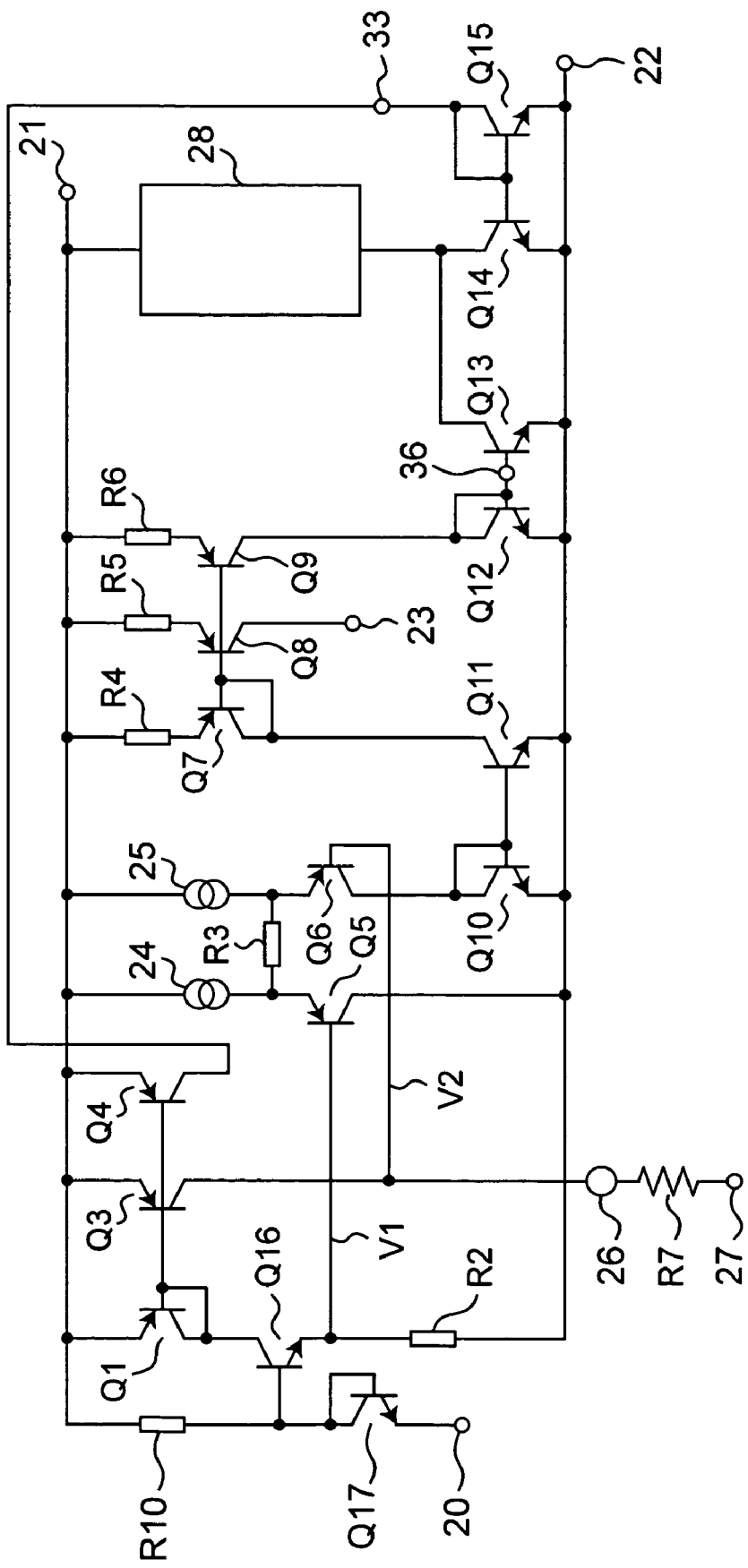
FIG. 4 is a circuit diagram showing a configuration of a fourth embodiment of the present invention.

In FIG. 4, the same functions as those of FIG. 3 are indicated by the same symbols. Numeral 15 indicates a constant voltage terminal, Q17 indicates an NPN transistor, and R10 indicates a resistor through which a bias current is supplied to Q17.

In FIG. 4, a collector-base voltage of Q17 raised by a base-emitter voltage from constant voltage 15 has a constant value, so that an emitter of Q16 also has a constant voltage if a difference in VBE between Q16 and Q17 is ignored. Therefore, a current obtained by dividing the constant voltage by R2 flows through R2, and this current flows also through 7 from a collector of Q16 by a current mirror circuit constituted of Q1, Q3, and Q4. It is to be noted that voltages at two ends of R2, that is, a voltage of the emitter of Q16 and a difference in voltage between two ends of R7 have values corresponding to fluctuations in bias current as described with reference to FIG. 3, so that by converting this voltage difference into a current by using a differential amplifier constituted of Q5 and Q6 and a current mirror circuit constituted of Q10 and Q11, it is possible to obtain from Q11 a current output that corresponds to fluctuations in bias current.

Next, a collector current of Q4 is supplied to the high-frequency circuit 28 by the current mirror circuit constituted of Q14 and Q15. Further, a collector current of Q9 is supplied to the high-frequency circuit 28 by the current mirror circuit constituted of Q12 and Q13. As described with reference to FIG. 3, a collector current of Q13 becomes small if a current of Q14 is larger than a center value and becomes large if the current of Q14 is smaller than the center value. Therefore, a current of the high-frequency circuit 28 is corrected by the collector current of Q13 even if an original base current or the collector current of Q14 increases or decreases. How much it is corrected is determined by changing an emitter resistance of the differential amplifier or a ratio among R4, R5, and R6

Fifth Embodiment

The following will describe the fifth embodiment of the present invention.

In a semiconductor integrated circuit of the fifth embodiment, if a current of an emitter follower through which a high-frequency signal passes is small, a current control circuit conducts such correction as to increase the current of the emitter follower so that proper characteristics may be kept and, if the emitter follower's current is large, conducts such correction as to decrease the current so that fluctuations in current may be suppressed, thereby reducing dissipation power.

Figure 5:
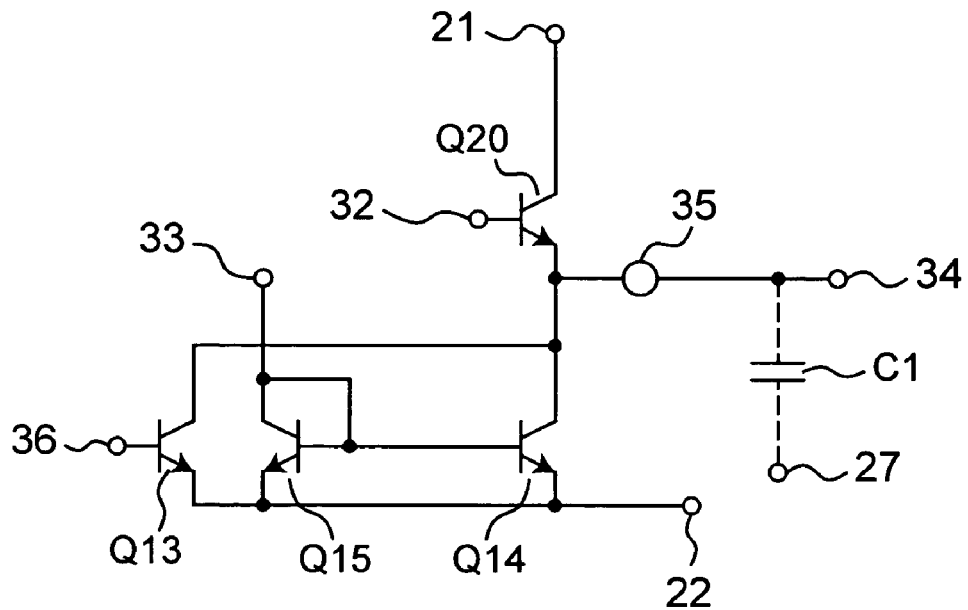
FIG. 5 is a circuit diagram showing a configuration of a fifth embodiment of the present invention.

FIG. 5 shows an emitter follower circuit, wherein the same functions as those of FIG. 3 are indicated by the same numerals. In FIG. 5, 33 indicates a bias current input terminal, 35 indicates a terminal of an IC, 34 indicates an output terminal, Q20 indicates an emitter follower transistor, 32 indicates an input terminal, C1 indicates a parasitic capacitor at the output terminal 34. An emitter follower is a buffer circuit often used between one stage and another of a high-frequency circuit and has its signal waveform distorted by a parasitic capacitance at its output, so that its gain is deteriorated. The distortion increases in proportion to values of a frequency and a parasitic capacity. This is improved by increasing a current. In particular, in a case where a signal is output from a terminal of a semiconductor integrated circuit, a large parasitic capacitance (C1) sticks to the signal and so a large current value is required; in fact, a sufficiently large current needs to flow in case where a gain is deteriorated if a current value decreases due to fluctuations. In the fifth embodiment, it is possible to detect a drop in bias current and, if the current is small, increase, by using the current control circuit, a current of the emitter follower through Q13 and, if the current is large, decrease the current through Q13 so that the current of the emitter follower may be corrected, thereby suppressing variations in characteristics and fluctuations in current as well.

Sixth Embodiment

The following will describe sixth embodiment of the present invention.

In a semiconductor integrated circuit of the sixth embodiment, if a current of a source follower through which a high-frequency signal passes is small, a current control circuit conducts such correction as to increase the current of the source follower so that proper characteristics may be kept and, if the source follower's current is large, conducts such correction as to decrease the current so that fluctuations in current may be suppressed, thereby reducing dissipation power.

Figure 6:
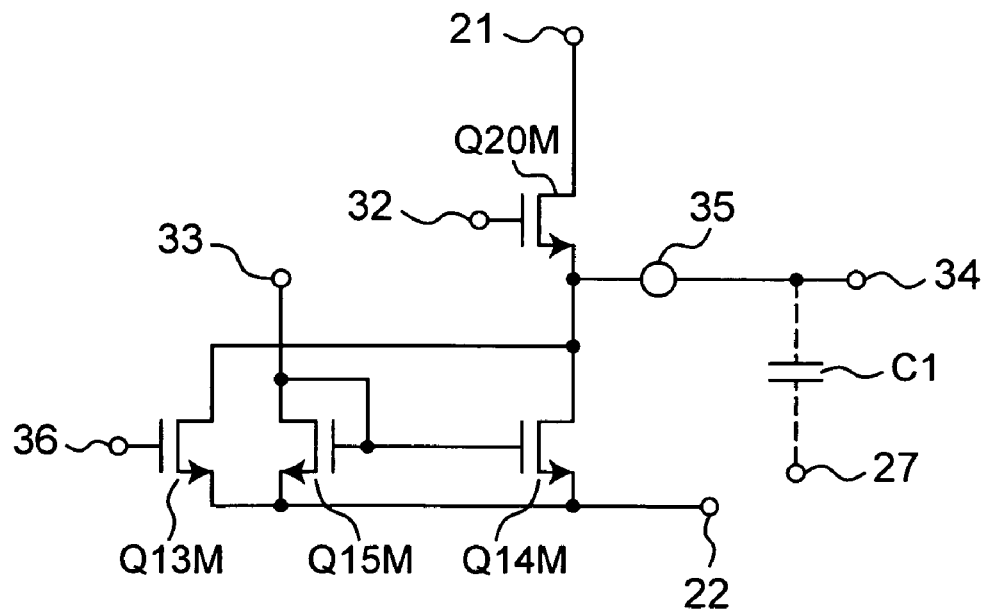
FIG. 6 is a circuit diagram showing a configuration of a sixth embodiment of the present invention.

FIG. 6 shows a source follower circuit, wherein the same functions as those of FIGS. 3 and 5 are indicated by the same numerals. In FIG. 6, Q20M indicates a source follower field effect transistor (FET), Q15M and Q14M are FETs which constitute a current mirror circuit. Similar to an emitter follower, a source follower is a buffer circuit often used between one stage and another of a high-frequency circuit and has its signal waveform distorted by a parasitic capacitance at its output and its gain deteriorated, which distortion increases in proportion to values of a frequency and a parasitic capacity. This phenomenon is improved by increasing a current. In particular, in a case where a signal is output from a terminal of a semiconductor integrated circuit, a large parasitic capacitance (C1) sticks to the signal and so a large current value is required; in fact, a sufficiently large current needs to flow in case where a gain is deteriorated if a current value decreases due to fluctuations. In the present invention, it is possible to detect a drop in bias current and, if the current is small, increase, by using the current control circuit, a current of the source follower through Q15M and, if the current is large, decrease the current through Q15M so that the current of the source follower may be corrected, thereby suppressing variations in characteristics and fluctuations in current as well.

Seventh Embodiment

The following will describe the seventh embodiment of the present invention.

In a semiconductor integrated circuit of the seventh embodiment, if a current of a local oscillator is small, a current control circuit conducts such correction as to increase the current of the local oscillator so that proper characteristics may be kept and, if the local oscillator's current is large, conducts such correction as to decrease the current so that fluctuations in current may be suppressed, thereby reducing dissipation power.

Figure 7:
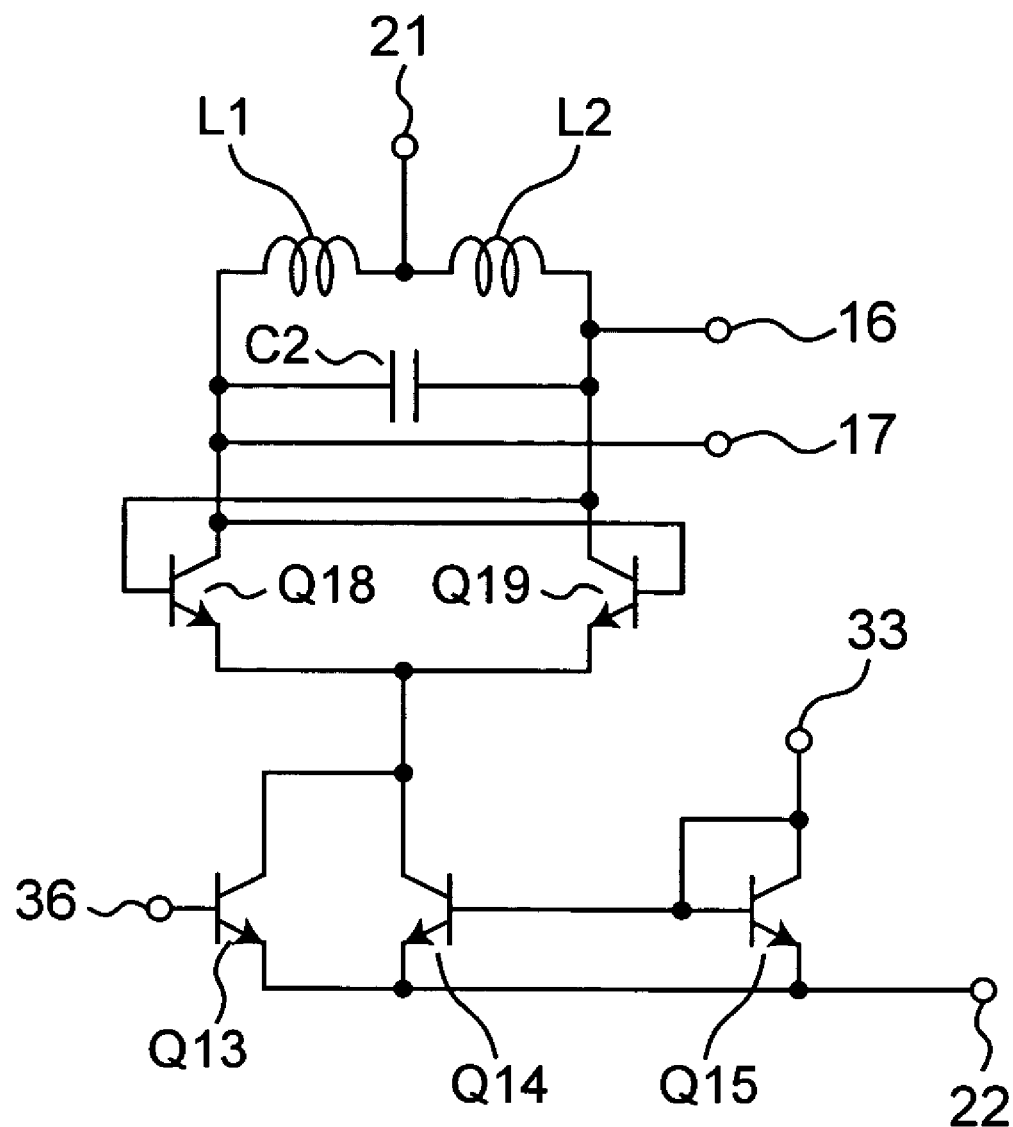
FIG. 7 is a circuit diagram showing a configuration of a seventh embodiment of the present invention.

FIG. 7 shows an example of the local oscillator, wherein the same functions as those of FIG. 3 are indicated by the same numerals. In FIG. 7 33 indicates a bias current input terminal, L1, L2, and C2 indicate inductors and a capacitor, Q18 and Q19 indicate transistors that constitute the oscillator, and 16 and 17 indicate an oscillation output terminal.

An oscillator used in a receiver is required to oscillate a high frequency and has good phase noise characteristics, so that an LC oscillator employing an LC resonant circuit is used. In the case of this type of oscillator, of course its characteristics depend on a current, besides which it has a fatal problem that oscillation stops if the current decreases. Therefore, a current value is designed with a sufficient margin so that oscillation may not stop, thus resulting in a block wherein it is hard to reduce dissipation power.

In the oscillator of the seventh embodiment, it is possible to detect a magnitude of a bias current and, if the bias current is small, flows a correction current so that the current may be increased and, if the current is large, decrease the current by using a correction circuit so that proper characteristics of the oscillator may be kept, thereby suppressing fluctuations in current and reducing dissipation power.

Eighth Embodiment

The following will describe the eighth embodiment of the present invention.

In a semiconductor integrated circuit of the eighth embodiment, if a current of a mixer is small, a current control circuit conducts such correction as to increase the current of the mixer so that proper characteristics may be kept and, if the mixer's current is large, conducts such correction as to decrease the current so that power dissipation may be decreased, thereby suppressing fluctuations in current.

Figure 8:
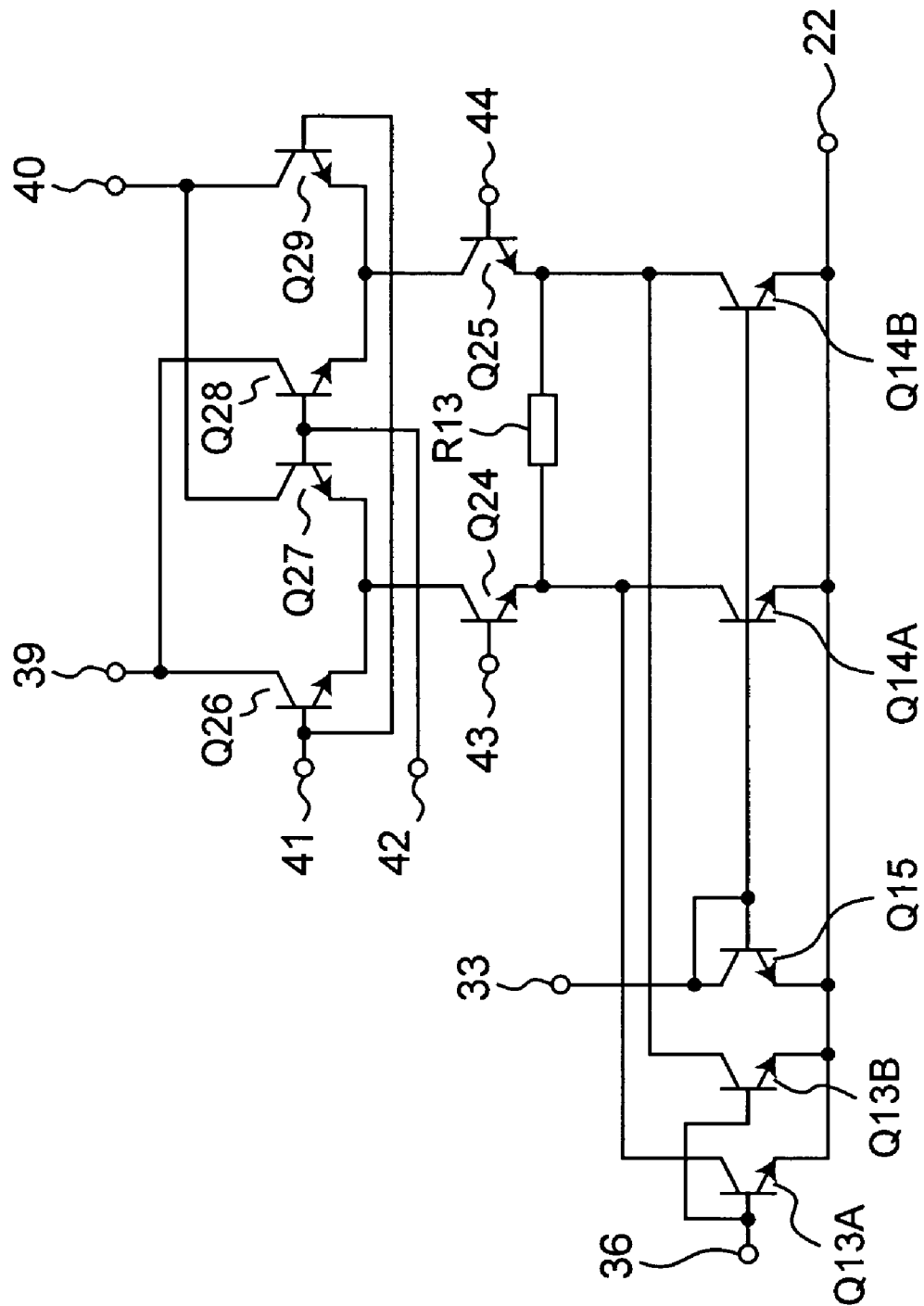
FIG. 8 is a circuit diagram showing a configuration of an eighth embodiment of the present invention.

FIG. 8 shows an example of the mixer, wherein the same functions as those of FIG. 3 are indicated by the same numerals. In FIG. 8, 33 indicates a bias current input terminal, Q24, Q25, Q26, Q27, Q28, and Q29 indicate transistors which constitute a multiplier, R13 indicates an emitter resistor, 43 and 44 indicate a received signal input terminal, 41 and 42 indicate a local-oscillated signal input terminal, and 39 and 40 indicate an output terminal of the mixer.

In FIG. 8, a received signal input from the received signal input terminals 43 and 44 is multiplied with a local-oscillated signal input from the local-oscillated signal input terminals 41 and 42 and output from the mixer output terminals 39 and 40. In this case, although signals having frequency components (fd+f1) and (fd−f1) of a frequency of the received signal and a frequency f1 of the local-oscillated signal respectively are output, generally the frequency component (fd+f1) is removed through a filer, permitting only the component of (fd−f1) to be output to the subsequent stage. The filter is not shown in FIG. 8.

Characteristics of this mixer including a conversion gain as well as an NF, a dynamic range, etc. all depend on a current value and deteriorate more as the current value decreases. For example, as for an NF, it is largely influenced by noise generated by Q24 and Q25 and thermal noise generated by R13, while the noise generated by Q24 and Q25 depends on a current. Therefore, the characteristics deteriorate if the current decreases due to fluctuations in manufacturing According to the mixer of the eighth embodiment, a bias current is detected, and if a current of the mixer is small due to Q13, a correction current flows so as to increase the current and, if the current of the mixer is large, the current is decreased by using a correction circuit so that a constant current may flow through the mixer, thereby enabling keeping proper characteristics and suppressing fluctuations in current to reduce dissipation power.

Ninth Embodiment

The following will describe the ninth embodiment of the present invention.

In a semiconductor integrated circuit of the ninth embodiment, if a current of a differential amplifier is small, correction is conducted so as to increase the current of the differential amplifier by using a current control circuit so that proper characteristics may be kept and, if the current of the differential amplifier is large, correction is conducted so as to decrease the current so that fluctuations in current may be suppressed, thereby reducing dissipation power.

Figure 9:
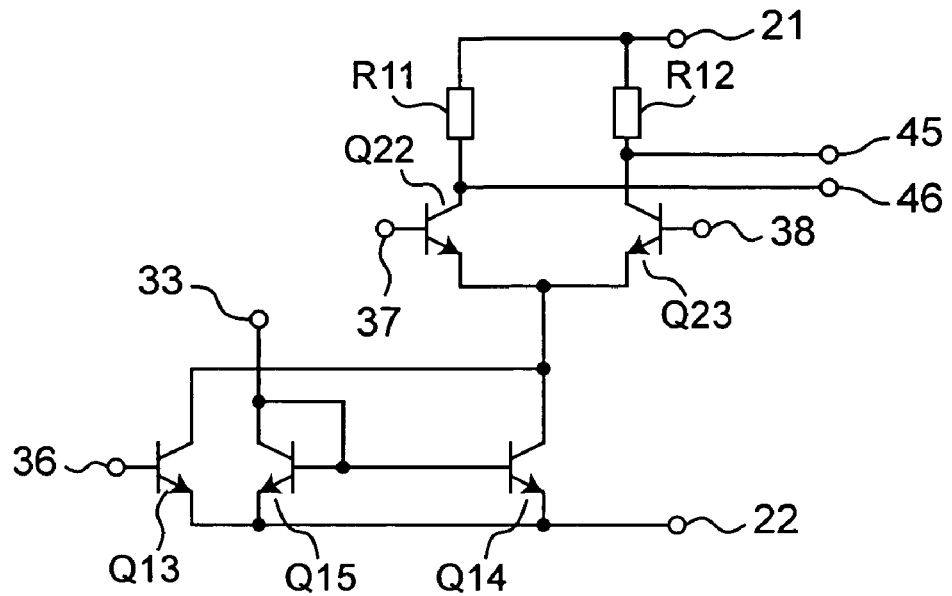
FIG. 9 is a circuit diagram showing a configuration of a ninth embodiment of the present invention.

FIG. 9 shows an example of the differential amplifier wherein the same functions as those of FIG. 3 are indicated by the same numerals. In FIG. 9, 33 indicates a bias current input terminal, Q22 and Q23 indicate transistors that constitute the differential amplifier R11 and R12 indicate a collector resistor 37 and 38 indicate an input terminal, and 45 and 46 indicate an output terminal. A differential amplifier may be used as a local oscillation buffer circuit arranged between a local oscillator and a mixer or as a frequency divider circuit for dividing a frequency of a local-oscillated signal and inputting it to a PLL circuit. In the case of a differential amplifier, a current value influences a gain and an output amplitude and a decrease in current deteriorates the gain and the output amplitude, thus leading to a deterioration in characteristics.

According to the differential amplifier of the ninth embodiment, a flowing bias current is detected, and if the bias current is small due to Q13, a correction current flows so as to increase the current of the differential amplifier and, if the bias current is large, the current of the differential amplifier is decreased by using a correction circuit, thereby enabling keeping proper characteristics and suppressing fluctuations in current to reduce dissipation power.

Tenth Embodiment

The following will describe the tenth embodiment of the present invention.

In a semiconductor integrated circuit of the tenth embodiment, a high-frequency circuit is provided with a current switch circuit, by which a current, if small, is increased through switchover and the current, if large, is decreased through switchover so that fluctuations in current may be suppressed, thereby reducing dissipation power.

Figure 10:
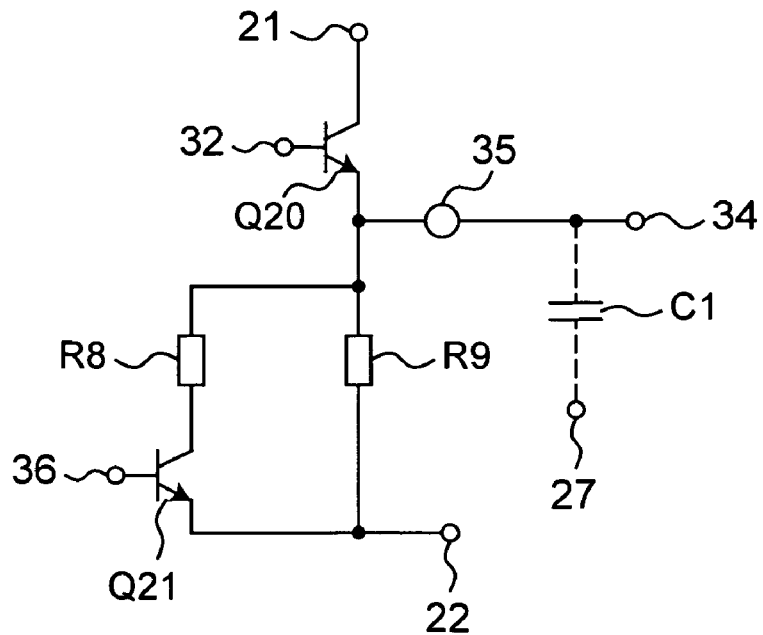
FIG. 10 is a circuit diagram showing a configuration of a tenth embodiment of the present invention.

FIG. 10 shows an example of an emitter follower circuit, wherein the same functions as those of FIG. 3 are indicated by the same numerals. Q20 indicates an emitter follower transistor, R9 indicates an emitter resistor, and R8 indicates an emitter resistor, which is connected to a collector of a switching transistor Q21. Numeral 36 indicates an output of a current control circuit, which provides voltage H if a bias current is small to turn ON Q21 so that a more current may flow through Q20, thus connecting R8 and R9 in parallel with each other to an emitter of Q20. On the other hand, if a current value is large, the current control circuit output 36 provides voltage L to turn OFF Q21, thus connecting only R9 to the emitter of Q20. By setting a resistance value of R9 and R8 in such a manner as to match a current value to be controlled, fluctuations in current of Q20 can be reduced.

In some high-frequency circuits, it is difficult to give a bias current by using a constant current source and, therefore, the current is determined by a resistor, wherein case a configuration of the present invention is effective. Further, if it is difficult to control a current because of an influence such as matching, a plurality of circuit having various current values, large and small, is prepared beforehand and can be switched from each other based on an output of the current detection circuit.

Eleventh Embodiment

The following will describe the eleventh embodiment from a viewpoint different from those of the first through tenth embodiments as a whole. Further, the eleventh embodiment will be described mainly about respects different from the first through tenth embodiments. The other configurations, operations, and effects are almost the same as those of the first through tenth embodiments and so their explanation is not repeated. In the figures, components having essentially the same configurations, operations, and effects are indicated by the same symbols.

Figure 11:
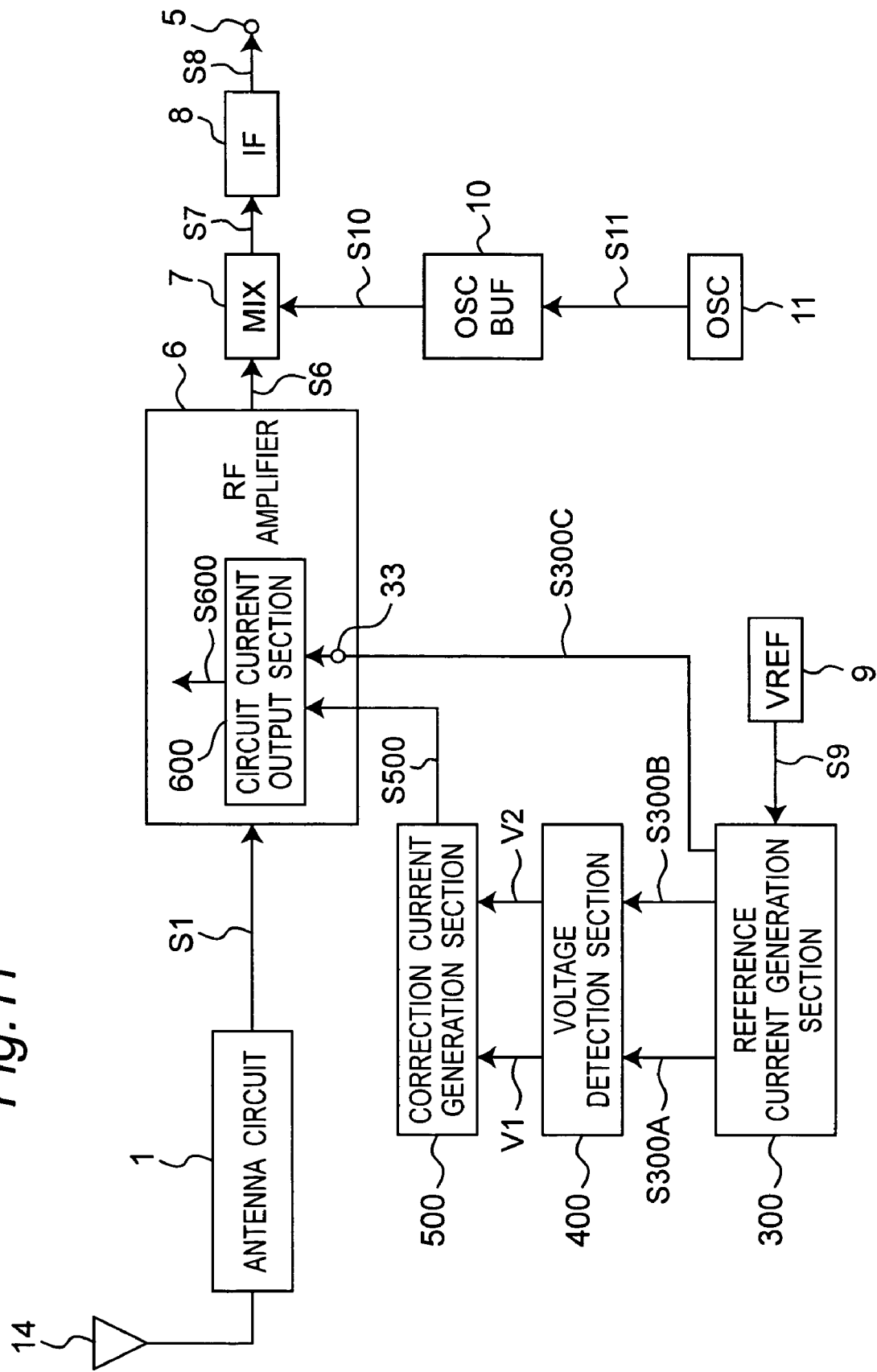
FIG. 11 is a block diagram showing an overall configuration of an eleventh embodiment of the present invention.

FIG. 11 is a block diagram showing an overall configuration of the eleventh embodiment.

In FIG. 11, an RF amplifier 6 amplifies a received signal A1 from an antenna circuit 1 by a predetermined multiplicative factor, which amplified received signal S6 is converted by a mixer (MIX) 7 into a predetermined intermediate-frequency signal S7, which is converted by an intermediate-frequency signal processing section (IF) 8 into a baseband signal S8, and a local oscillator (OSC) 11 generates a local-oscillated signal S1 based on a difference in frequency between the received signal S1 and the intermediate-frequency signal S7, which signal S11 is amplified by a buffer circuit (OSCBUF) 10 and supplied to the mixer 7. The local oscillator 11 is generally constituted of a phased-locked loop (PLL).

A reference power source (VREF) 9 generates a reference voltage S9 which is set to a constant voltage. The reference power source 9 is referred to as a reference voltage source also. A reference current generation section 300 generates roughly equal reference currents S300A, S300B, and S300C of three systems based on the reference voltage S9. A voltage detection section 400, which includes two resistors, detects voltages V1 and V2 generated across these resistors when the reference currents S300A and S300B flow through them respectively. These two resistors are both referred to as a load. A correction current generation section 500 compares the voltages V1 and V2 to each other, to generate a correction current S500 based on a result of the comparison.

A circuit current output section 6 in the RF amplifier 6 generates a circuit current S600 based on a sum of the correction current S500 and the reference current S300C. The circuit current S600 is required for operations of an electronic circuit in the RF amplifier 6. The reference current S300C accounts for, for example, about 80% of the circuit current S600. The remaining is accounted for by the correction current S500. As described later, the reference current fluctuates with deviations in manufacturing processes, which fluctuations are corrected by the correction current S500, so that the circuit current S600 as a whole stays roughly constant against variations in the manufacturing processes.

Although in FIG. 11 the circuit current output section 600 is provided only to the RF amplifier 6, the circuit current output section 600 can be provided to at least one of the RF amplifier 6, the mixer 7, the local oscillator 11, the buffer 10, and the intermediate-frequency signal processing section 8 so that the circuit current S600 may be generated on the basis of a sum of the correction current S500 and the reference current S300C. Such a configuration that the circuit current output section 600 is provided to supply the circuit current S600 is referred to as a circuit current operation section also. That is, the circuit current operation section provides at least one of the RF amplifier 6, the mixer 7, the local oscillator 11, the buffer circuit 10, and the intermediate-frequency signal processing section 8.

The reference power source 9, the reference current generation section 300, the voltage detection section 400, the correction current generation section 500, and the circuit current output section 600 constitute a circuit current generation apparatus of the present invention. The circuit current generation apparatus and the above-described circuit current operation section constitute a signal processing apparatus of the present invention.

Although in FIG. 11 the reference power source 9 is provided only to the reference current generation section 300, such a configuration may be provided that the reference voltage S9 is similarly provided to the RF amplifier 6, the mixer 7, the local oscillator 11, the buffer 10, and the intermediate-frequency signal processing section 8.

The reference power source 9, the reference current generation section 300, the voltage detection section 400, and the correction current generation section 500 are included in one semiconductor integrated circuit (IC) 100. However, the two resistors in the voltage detection section 400 are inside and outside the integrated circuit respectively, the resistor outside which is not included in the semiconductor integrated circuit 100. The resistor inside the integrated circuit is referred to as an intra-integrated circuit load also and resistor outside the integrated circuit is referred to as an extra-integrated circuit load also. Further, of the RF amplifier 6, the mixer 7, the local oscillator 11, the buffer circuit 10, and the intermediate-frequency signal processing section 8, the above-described circuit current operation section may be configured so as to be included in the semiconductor integrated circuit 100.

Figure 12:
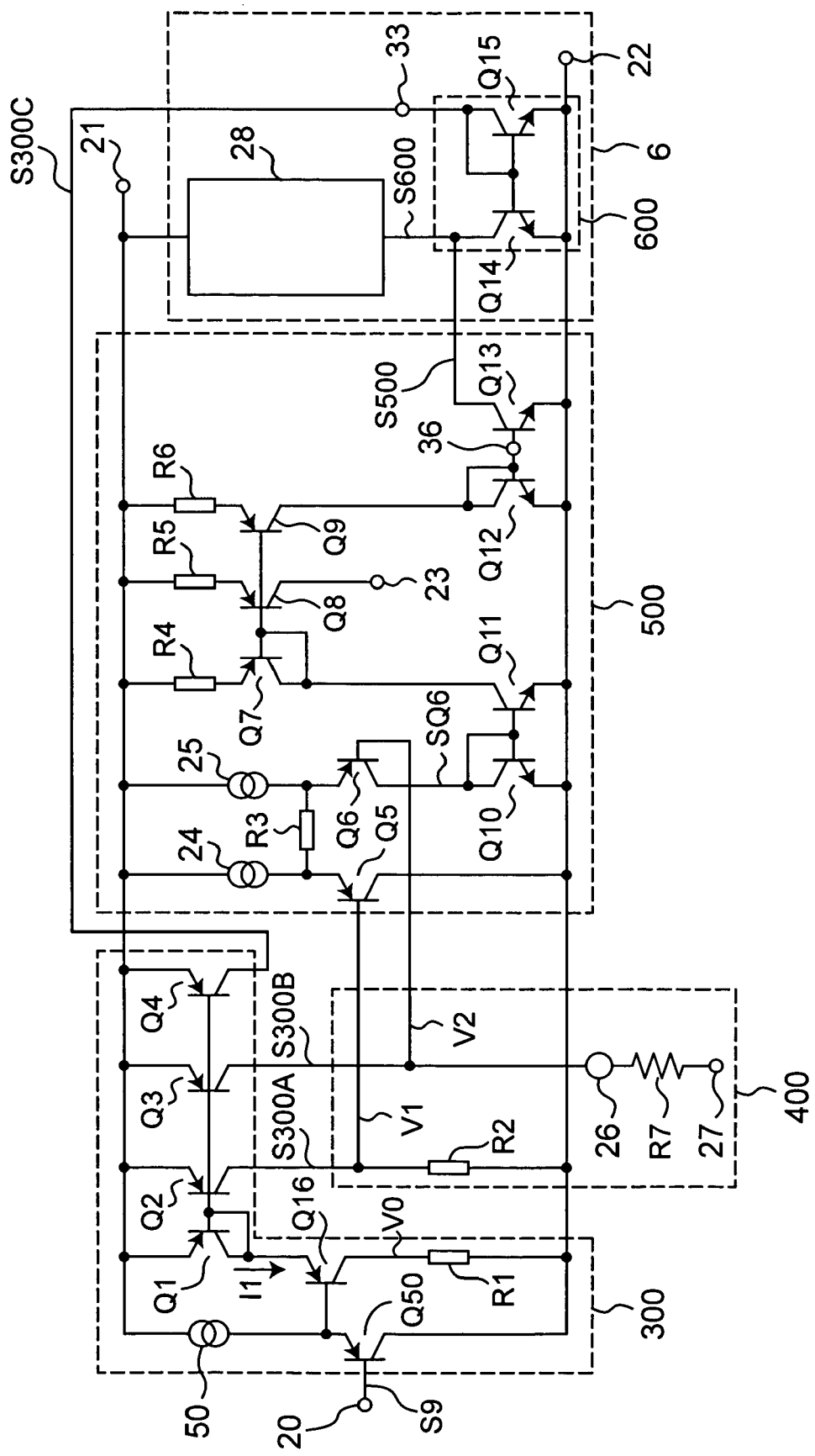
FIG. 12 is a circuit diagram showing a major portion in the eleventh embodiment of the present invention.

FIG. 12 is a circuit diagram of a major portion in the eleventh embodiment.

In FIG. 12, transistors Q50 and Q16 perform current amplification on a reference voltage S9 input to a base terminal 20 of a transistor Q50 to generate emitter voltage V0 at an emitter terminal of a transistor Q16. The emitter voltage V0 is generated by adding a base-emitter voltage of the transistor Q50 to the reference voltage S9 and subtracting from this sum by a base-emitter voltage of the transistor Q16. Further, the transistors Q50 and Q16 are configured in one semiconductor integrated circuit 100 (which is described later). Therefore, the emitter voltage V0 is set to a constant value essentially equal to the reference voltage S9 regardless of fluctuations in manufacturing and temperature characteristics.

The transistor Q16 generates at a collector terminal a reference current I1 given by the following equation, based on the emitter voltage V0 and a reference resistor R1 having a predetermined resistance.

$$I1 = V/R1 \tag{1}$$

That is, the reference current I1 is generated by applying the emitter voltage V0 essentially equal to the reference voltage S9 to the reference resistor R1. The reference resistor R1 is referred to as a reference load also.

By a first current mirror circuit constituted of transistors Q1, Q2, Q3, and Q4, collector currents of the transistors Q2, Q3, and Q4 are roughly equalized to a collector current of the transistor Q1. That is, to collector terminals of the transistors Q2, Q3, and Q4 also, the reference currents S300A, S300B, and S300C roughly equal to the reference current I1 flow respectively. The transistors Q50, Q16, Q1, Q2, Q3, Q4, a current source 50, and the reference resistor R1 are included in the reference current generation section 300. The reference current generation section 300 generates the roughly equal reference currents S300A, S300B, and S300C for the three systems based on the reference voltage S9.

The circuit current output section 600 configures a second current mirror circuit by using transistors Q15 and Q14, input the reference current S300C from a terminal 33, and inputs a correction current S500 via a terminal 36. The circuit current output section 600 adds up the reference current S300C and the correction current S500 to generate a circuit current S600 and output it to a high-frequency circuit 28. The high-frequency circuit 28 is referred to as an electronic circuit also because it may be a generic circuit for use other than high-frequency applications. The reference current S300C varies with each of the semiconductor integrated circuit 100 mainly because of fluctuations in resistance of the reference resistor R1. Therefore, hereinafter, fluctuations in resistance of the reference resistor R1 are detected, so that based on a result of the detection the correction current S500 is generated to reduce fluctuations in value of the circuit current S600.

When the reference currents S300A and S300B flow through resistors R2 and R7 respectively, voltages V1 and V2 are generated in accordance with the following equations.

$$V1 = R2*I1 = (R2/R1)*V0 \quad (2)$$

$$V2 = R7*I1 = (R7/R1)*V0 \quad (3)$$

The resistor R2 is included in the semiconductor integrated circuit 100 and corresponds to the above-described intra-integrated circuit resistor. The resistor R7 is not included in the semiconductor integrated circuit 100 and corresponds to the above-described extra-integrated circuit resistor. The extra-integrated circuit resistor R7 employed has a resistance accuracy of, for example, about ±1% and is interposed between an external connection terminal (IC terminal) 26 of the semiconductor integrated circuit 100 and an earth terminal (extra-IC earth terminal) 27 outside the semiconductor integrated circuit 100. Generally, a resistance of the resistor R7 is aligned with a fluctuation center value of a resistance of the resistor R2

It is to be noted that the reference current I1 generated in the semiconductor integrated circuit 100 varies with fluctuations in manufacturing processes of the reference resistor R1. The reference resistor R1 fluctuates within, for example, about ±15%. However, the reference resistors R1 and the resistor R2 manufactured in the same semiconductor integrated circuit 100 have small relative fluctuations with each other, so that (R2/R2) becomes roughly constant. Therefore, the voltage V1 is roughly constant regardless of fluctuations in manufacturing processes since the voltage V0 in Equation 2 is also constant as described above.

On the other hand, in Equation 3, the resistor R7 is outside the semiconductor integrated circuit 100 and has a high accuracy, so that the voltage V2 fluctuates with fluctuations in manufacturing processes in inverse proportion to a resistance of the resistor R1. The resistors R2 and R7 are included in the voltage detection section 400. The voltage detection section 400 detects voltages V1 and V2 generated across the resistors R2 and R7 when the reference currents S300A and S300B flow through them respectively. Although the voltage V1 has been defined to be a voltage across the resistor R2, voltage V0 across the resistor R1 may be used, which is also roughly constant regardless of fluctuations in manufacturing processes similarly.

A differential amplifier constituted of the transistors Q5 and Q6, the resistor R3, and the current sources 24 and 25 generates a collector current SQ6 (Equation 4) of the transistor Q6 based on differential voltage (V1−V2) between the voltages V1 and V2.

$$SQ6 = (V1-V2)*KR3 + SQ60 \quad (4)$$

where a current SQ6 provides a collector current SQ6 in a case where the voltages V1 and V2 are equal to each other and a coefficient KP3 has a value that increases as a resistance of the resistor R3 decreases and decreases as it increases. Since a resistance value of the resistor R7 needs to be aligned with a fluctuation center of the resistance of the resistor R2, if the resistance of the resistor R2 coincides with the fluctuation center, the voltages V1 and V2 equal each other. The collector current SQ6 is referred to as a comparison result current also.

A third current mirror circuit constituted of the transistors Q10 and Q11, a fourth current mirror circuit constituted of the transistors Q7, Q8, and Q9 and the resistors R4, R5, and R6, and a fifth current mirror circuit constituted of the transistors Q12 and Q13 transfer the comparison result current SQ6 to supply the correction current S500 to the circuit current output section 600. It is to be noted that a collector terminal of the transistor Q11 may be directly connected to a collector terminal of the transistor Q14 to use a collector current of the transistor Q11 as the correction current S500. It is thus possible to omit the fourth and fifth ones of these three current mirror circuits.

The above-described differential amplifier and third, fourth, and fifth current mirror circuits are included in the correction current generation section 500. The correction current generation section 500 compares voltages V1 and V2 to each other to generate the correction current S500 based on a result of the comparison. It is to be noted that the fifth current mirror circuit may be configured to be included together with the second current mirror circuit in the circuit current output section 600. In this case, the RF amplifier 6 has the circuit current output section 600 that includes the second and fifth current mirror circuits.

In such an eleventh embodiment, if a resistance of the reference resistor R1 is smaller than a fluctuation center, the reference current I1 becomes larger than a fluctuation center and the reference current S300C also becomes larger than a fluctuation center. As a result, the voltage V2 becomes larger than the voltage V1, so that the current SQ60, that is, the correction current S500 becomes smaller than the fluctuation center in accordance with Equation 4. Oppositely, if the resistance of the reference resistor R1 is larger than a fluctuation center, the reference current I1 becomes smaller than a fluctuation center and the reference current S300C also becomes smaller than a fluctuation center. As a result, the voltage V2 becomes smaller than the voltage V1, so that the current SQ60, that is, the correction current S500 becomes smaller than the fluctuation center in accordance with Equation 4. In such a manner, a deviation of the reference current S300C from a fluctuation center is compensated for by the correction current S500, so that the circuit current S600 stays roughly constant regardless of fluctuations in manufacturing.

A ratio of the correction current S500 with respect to the reference current S300C is adjusted by the resistor R3, that is, the coefficient KR3 or the resistors R4, R5, and R6. Further, in the case of supplying a circuit current not only to the RF amplifier 6 but also to such circuits as the mixer 7, the local oscillator 11, the local oscillation buffer circuit 10, and the intermediate-frequency signal processing section, a correction current can be supplied via a terminal 23 from the transistor Q8. In this case, by using the resistor R5, the correction current can be adjusted for each of the circuits. Further, similar to a correction current, different reference currents can also be supplied to these different circuits by providing a current adjusting emitter resistor between an emitter terminal of each of the transistors Q1, Q2, Q3, and Q4 and the power source terminal 21 and also adding, in parallel with these, some series circuits each of which is comprised of a transistor and a current adjusting emitter resistor.

As described above, by supplying the high-frequency circuit 28 with the circuit current S600, which is roughly constant regardless of fluctuations in manufacturing processes, based on the present invention, it is possible to give a minimum required circuit current S600 without deteriorating characteristics even with fluctuations in manufacturing processes, thereby reducing dissipation power of the semiconductor integrated circuit 100.

Twelfth Embodiment

The twelfth embodiment will be described mainly about respects different from the eleventh embodiment. The other configurations, operations, and effects are almost the same as those of the eleventh embodiment and so their explanation is not repeated. In the figures, components having essentially the same configurations, operations, and effects are indicated by the same symbols.

Figure 13:
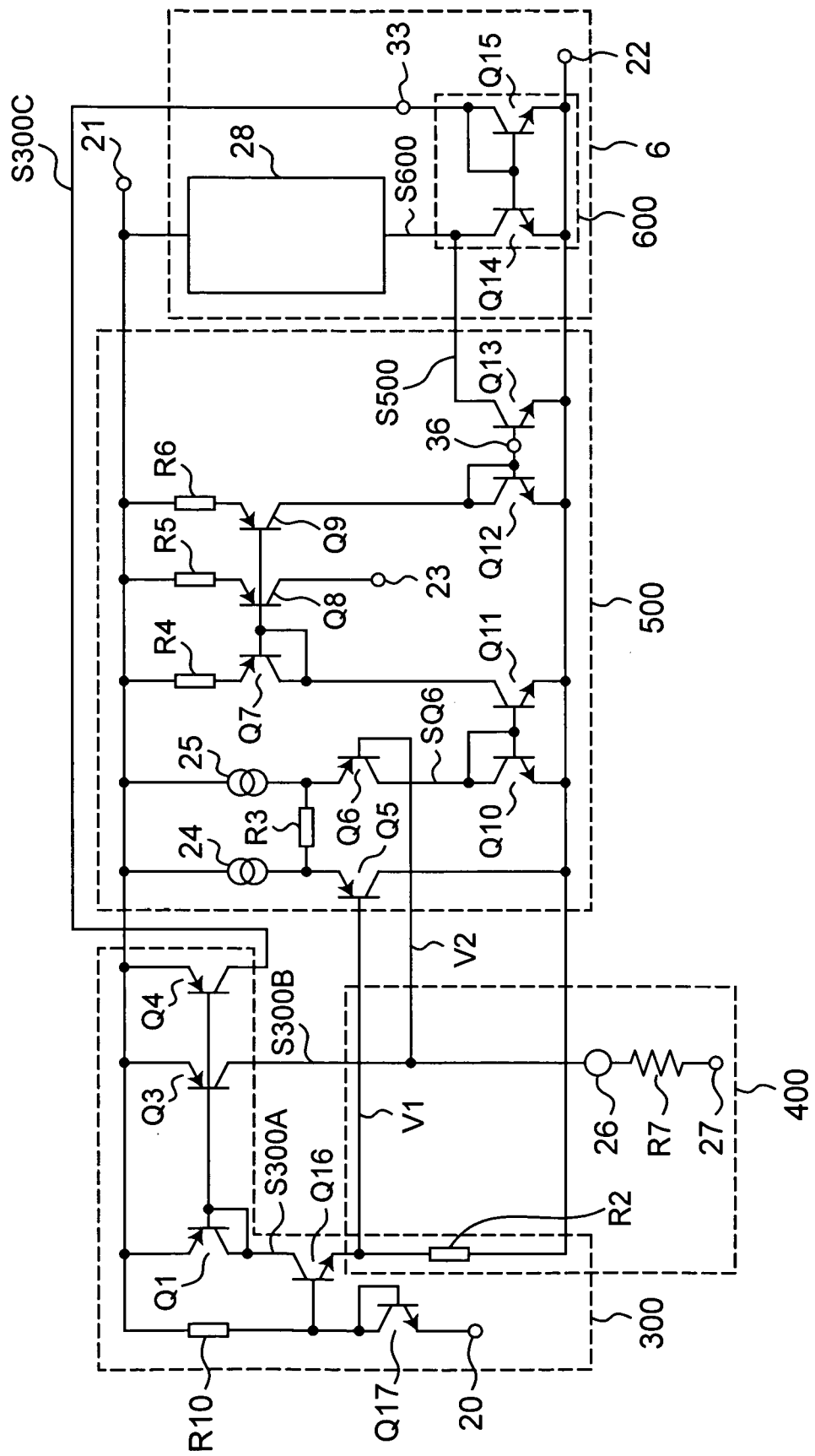
FIG. 13 is a circuit diagram showing a major portion in a twelfth embodiment of the present invention.

FIG. 13 is a circuit diagram showing a major portion of the twelfth embodiment.

In FIG. 13, transistors Q17 and Q16 perform current amplification on a reference voltage S9 input to an emitter terminal 20 of a transistor Q17 to generate emitter voltage V1 at an emitter terminal of a transistor Q16. The emitter voltage V1 is generated by adding a base-emitter voltage of the transistor Q17 to the reference voltage S9 and subtracting from this sum by a base-emitter voltage of the transistor Q16. Further, the transistors Q17 and Q16 are configured in one semiconductor integrated circuit 100. Therefore, the emitter voltage V0 is set to a constant value essentially equal to the reference voltage S9 regardless of fluctuations in manufacturing and temperature characteristics.

The transistor Q16 generates at a collector terminal a reference current S300A given by the following equation, based on the emitter voltage V1 and a reference resistor R2 having a predetermined resistance.

$$S300A = V1/R2 \quad (1)$$

By a first current mirror circuit constituted of transistors Q1, Q3, and Q4, collector currents of the transistors Q3 and Q4 are roughly equalized to a collector current of the transistor Q1. That is, to collector terminals of the transistors Q2 and Q4 also, reference currents S300B and S300C roughly equal to the reference current S300A flow respectively. The transistors Q17, Q16, Q1, Q3, and Q4, a resistor R10, and the reference resistor R2 are included in the reference current generation section 300. The reference current generation section 300 generates the roughly equal reference currents S300A, S300B, and S300C for three systems based on the reference voltage S9.

The resistors R2 and R7 are included in a voltage detection section 400. The voltage detection section 400 detects voltages V1 and V2 generated across the resistors R2 and R7 when the reference currents S300A and S300B flow through them respectively. That is, the twelfth embodiment employs a configuration that the reference current generation section 300 and the voltage detection section 400 shares the one resistor R2.

Similar to the eleventh embodiment, in the twelfth embodiment also, by supplying a high-frequency circuit 28 with the circuit current S600, which is roughly constant regardless of fluctuations in manufacturing processes, based on the present invention, it is possible to give a minimum required circuit current S600 without deteriorating characteristics even with fluctuations in manufacturing processes, thereby reducing dissipation power of the semiconductor integrated circuit 100.

Thirteenth Embodiment

The thirteenth embodiment will be described mainly about respects different from the eleventh and twelfth embodiments. The other configurations, operations, and effects are almost the same as those of the eleventh and twelfth embodiments and so their explanation is not repeated. In the figures, components having essentially the same configurations, operations, and effects are indicated by the same symbols.

Figure 14:
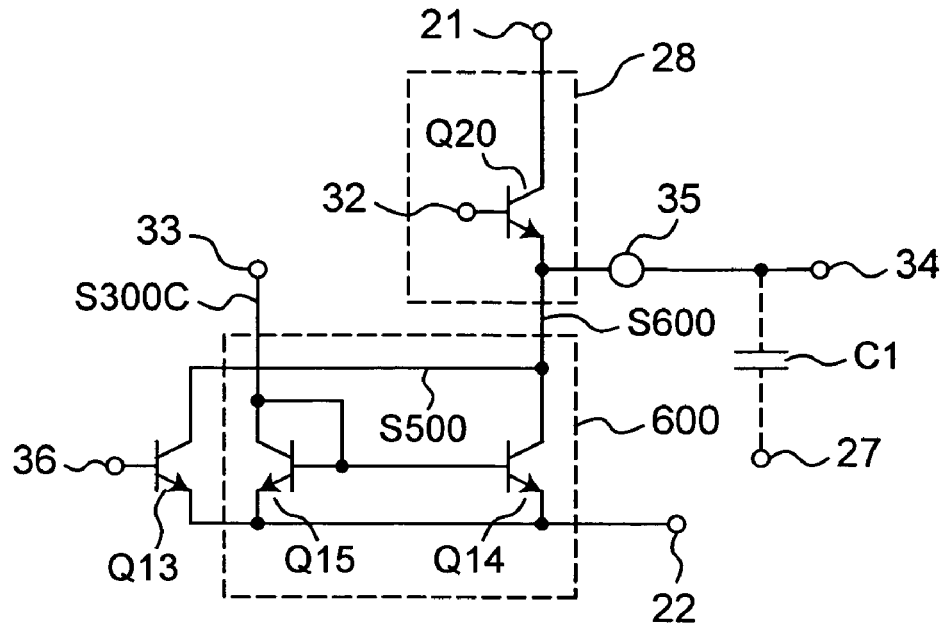
FIG. 14 is a circuit diagram showing a configuration of a practical example 1 of a high-frequency circuit and a circuit current output section in a thirteenth embodiment of the present invention.

FIG. 14 is a circuit diagram showing a configuration of a practical example 1 of a high-frequency circuit and a circuit current output section in the thirteenth embodiment.

In FIG. 14, a high-frequency circuit 28 includes an emitter follower circuit by use of a transistor Q20. The emitter follower circuit is connected to an output terminal 34 via an IC terminal 35, to generate a parasitic capacitor C1 between the output terminal 34 and an extra-IC earth terminal 27. The parasitic capacitor C1 distorts a signal waveform at the extra-IC earth terminal 27 to decrease a gain. The distortion increases in proportion to values of a frequency and a parasitic capacity but is decreased by increasing a circuit current S600.

As described above, by supplying the high-frequency circuit 28 including an emitter follower with the circuit current S600, which is roughly constant regardless of fluctuations in manufacturing processes, based on the present invention, it is possible to give a minimum required circuit current S600 without deteriorating characteristics even with fluctuations in manufacturing processes, thereby reducing dissipation power of the semiconductor integrated circuit 100.

Figure 15:
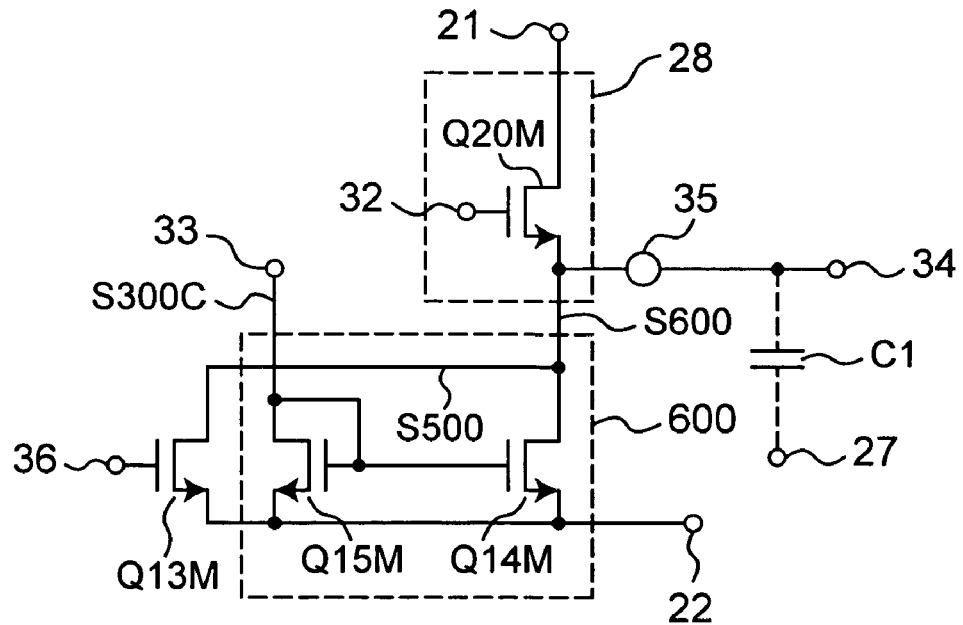
FIG. 15 is a circuit diagram showing a configuration of a practical example 2 of a high-frequency circuit and a circuit current output section in a thirteenth embodiment of the present invention.

FIG. 15 is a circuit diagram showing a configuration of a practical example 2 of the high-frequency circuit and the circuit current output section in the thirteenth embodiment.

In practical example 2 of FIG. 15, in place of the transistors Q20, Q14, Q15, and Q13 of practical example 1 shown in FIG. 14, field effect transistors (FETs) Q20M, Q14M, Q15M, and Q13M are used respectively. The high-frequency circuit 28 includes a source follower circuit by use of the field effect transistor Q20M. The other configurations, operations, and effects are almost the same as those of practical example 1 and so their explanation is not repeated.

Figure 16:
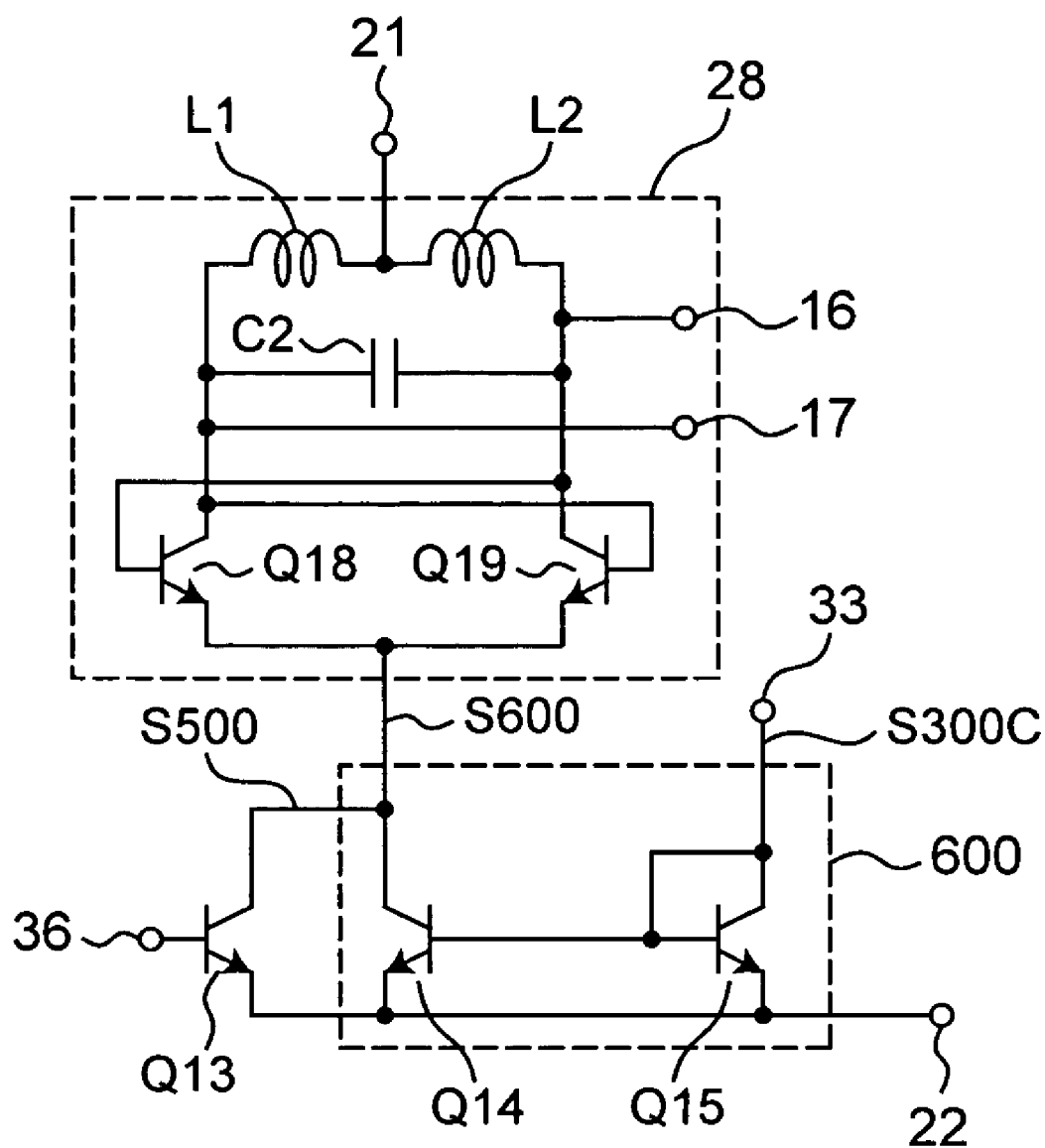
FIG. 16 is a circuit diagram showing a configuration of a practical example 3 of a high-frequency circuit and a circuit current output section in a thirteenth embodiment of the present invention.

FIG. 16 is a circuit diagram showing a configuration of practical example 3 of the high-frequency circuit and the circuit current output section in the thirteenth embodiment.

In FIG. 16, the high-frequency circuit 28 includes a voltage-controlled oscillator (VCO) provided to a local oscillator 11. Transistors Q18 and Q19 oscillates based on an LC resonant circuit constituted of inductors L1 and L2 and a capacitor C2, to output a local-oscillated signal S11 from terminals 16 and 17.

The VCO used in the semiconductor integrated circuit 100 is required to have good phase noise characteristics at a high oscillated frequency. Such oscillation characteristics depend on a magnitude of the circuit current S600 and are improved as the circuit current S600 increases but, if the circuit current S600 decreases, lead to suspension of oscillation in the worst case.

As described above, by supplying the high-frequency circuit 28 including a VCO with the circuit current S600, which is roughly constant regardless of fluctuations in manufacturing processes, based on the present invention, it is possible to give a minimum required circuit current S600 without deteriorating characteristics even with fluctuations in manufacturing processes, thereby reducing dissipation power of the semiconductor integrated circuit 100.

Figure 17:
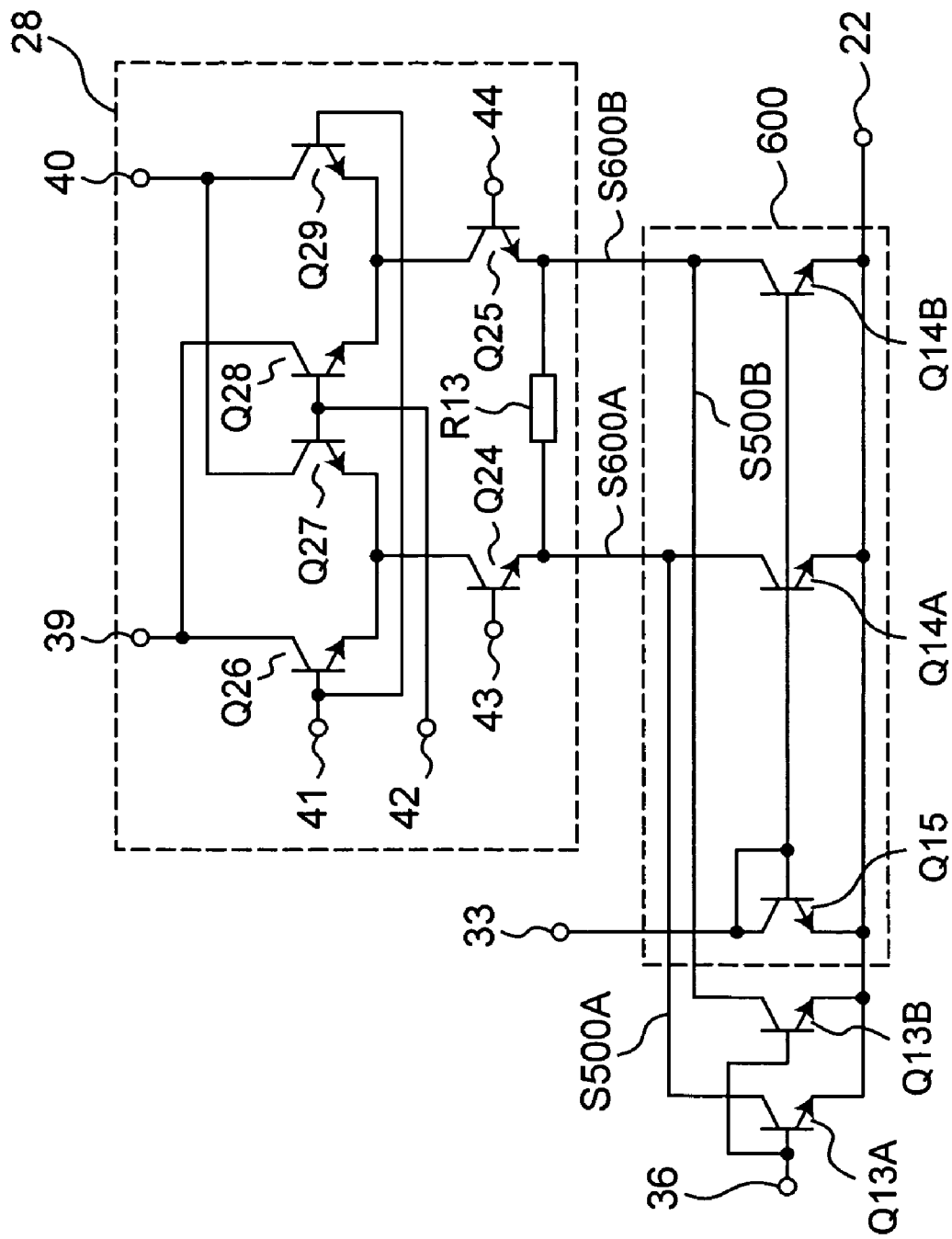
FIG. 17 is a circuit diagram showing a configuration of a practical example 4 of a high-frequency circuit and a circuit current output section in a thirteenth embodiment of the present invention.

FIG. 17 is a circuit diagram showing a configuration of practical example 4 of the high-frequency circuit and the circuit current output section in the thirteenth embodiment.

In FIG. 17, a circuit current output section 600 configures a second current mirror circuit by using the transistors Q15, Q14A, and Q14B, inputs a reference current S300C from a terminal 33, and inputs correction currents S500A and S500B via a terminal 36 and transistors Q13A and Q13B respectively. The circuit current output section 600 adds up the reference current S300C and the correction currents S500A and S500B to generate circuit currents S600A and S600B respectively and output them to a high-frequency circuit 28.

The high-frequency circuit 28 includes a mixer 7. Transistors Q24 and Q25 input an amplified received signal S6 from each of terminals 43 and 44, input an amplified local-oscillated signal S10 from each of terminals 41 and 42, multiply the amplified received signal S6 and the amplified local-oscillated signal S10 with each other by using transistors Q26, Q27, Q28, and Q29, and output a mixture result signal from terminals 39 and 40 at an amplification which is set on the basis of a resistance of a resistor R13. The mixture result signal has two frequency components of sum frequency (fd+f1 and difference frequency (fd−f1) based on a frequency fd of the received signal S6 and a frequency f1 of the local-oscillated signal S10, only which difference frequency component (fd−f1) is output as an intermediate-frequency signal S7 through a band pass filter.

Characteristics of the mixer 7 including a conversion gain, an NF, a dynamic range, etc. all depend on a current value of the circuit current S600 and generally deteriorate more as the circuit current decreases. For example, as for an NF, it is largely influenced by noise generated by the transistors Q24 and Q25 and thermal noise generated by the resistor R13. In particular, the noise generated by the transistors Q24 and Q25 depends on a current, so that the NF deteriorates if the circuit current S600 decreases due to fluctuations in manufacturing As described above, by supplying the high-frequency circuit 28 including the mixer 7 with the circuit current S600, which is roughly constant regardless of fluctuations in manufacturing processes, based on the present invention, it is possible to give a minimum required circuit current S600 without deteriorating characteristics even with fluctuations in manufacturing processes, thereby reducing dissipation power of the semiconductor integrated circuit 100.

Figure 18:
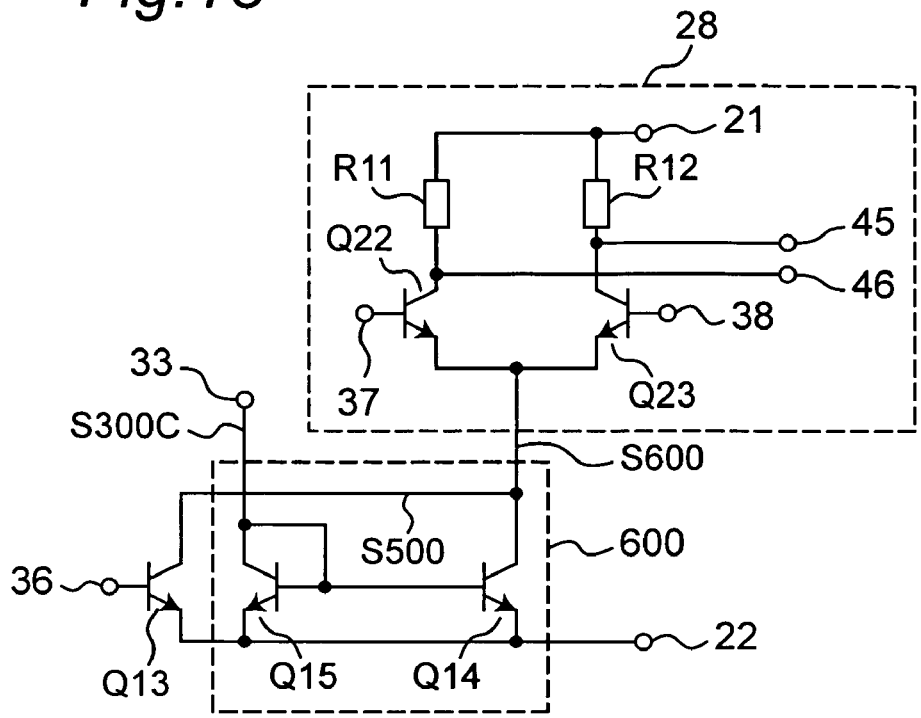
FIG. 18 is a circuit diagram showing a configuration of a practical example 5 of a high-frequency circuit and a circuit current output section in a thirteenth embodiment of the present invention.

FIG. 18 is a circuit diagram showing a configuration of practical example 5 of the high-frequency circuit and the circuit current output section in the thirteenth embodiment.

In FIG. 18, the high-frequency circuit 28 includes a differential amplifier. Transistors Q22 and Q23 input a signal from terminals 37 and 38 and output the signal from terminals 45 and 46 at an amplification which is set on the basis of resistances of resistors R11 and R13. The differential amplifier is used in a local oscillation buffer 10 etc.

An amplification and a dynamic range of a differential amplifier largely depend on a magnitude of the circuit current S600 and deteriorate as the circuit current S600 decreases. By supplying the high-frequency circuit 28 including the differential amplifier with the circuit current S600, which is roughly constant regardless of fluctuations in manufacturing processes, based on the present invention, it is possible to give a minimum required circuit current S600 without deteriorating characteristics even with fluctuations in manufacturing processes, thereby reducing dissipation power of the semiconductor integrated circuit 100.

Figure 19:
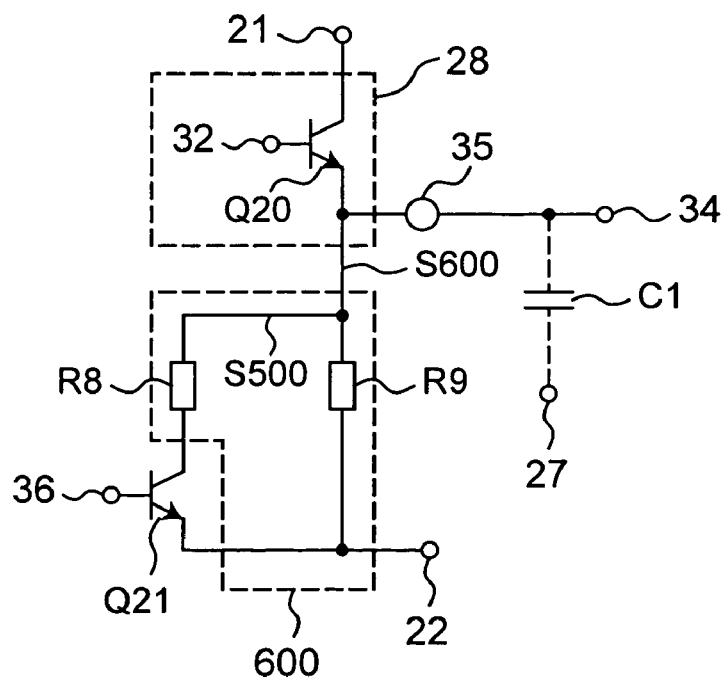
FIG. 19 is a circuit diagram showing a configuration of a practical example 6 of a high-frequency circuit and a circuit current output section in a thirteenth embodiment of the present invention.

FIG. 19 is a circuit diagram showing a configuration of practical example 6 of the high-frequency circuit and the circuit current output section in the thirteenth embodiment.

In FIG. 19, the circuit current output section 600 configures an emitter resistor circuit by using resistors R8 and R9 and inputs a correction current S500 via the terminal 36 and the transistor Q21. The circuit current output section 600 generates a circuit current S600 based on the correction current S500 and outputs it to the high-frequency circuit 28. The high-frequency circuit 28 includes an emitter follower circuit by use of the transistor Q20. The parasitic capacitor C1 is the same as that of the first embodiment and so its explanation is not repeated.

By applying a base voltage proportional to the reference voltage S9 to the terminal 39, a current proportional to the reference current S300C flows through the resistor R9. The resistor R9 is arranged in the semiconductor integrated circuit 100 similar to the reference resistor R1 and so has small relative fluctuations with the reference resistor R1. It is to be noted that the transistor Q21 is set to be turned ON and OFF if the comparison result current SQ6 is large and small respectively.

If a resistance of the resistor R9 is larger than a fluctuation center, the current flowing through the resistor R9 becomes smaller than a fluctuation center. As a result, the transistor Q21 is turned ON, to add the correction current S500 to the circuit current S600 through the resistor R8. Oppositely, if the resistance of the reference resistor R1 is smaller than a fluctuation center, the current flowing through the resistor R9 becomes larger than a fluctuation center and the comparison result current SQ6 becomes smaller than a fluctuation center. As a result, the transistor Q21 is turned OFF to prevent the correction current S500 from flowing, so that only the circuit current S600 flows through the resistor R9. In such a manner, a deviation of the current flowing through the resistor R9 from a fluctuation center is compensated for by the correction current S500, so that the circuit current S600 stays roughly constant regardless of fluctuations in manufacturing.

In some cases, the high-frequency circuit 28 is configured by such a resistor circuit as practical example 6 if it is difficult to give the circuit current S600 by a constant current source. Further, if continual generation of the correction current S500 as in the case of the eleventh embodiment owing to an influence of impedance matching etc., a plurality of circuits having different magnitudes of the correction current S500 can be provided and switched from each other based on the comparison result current SQ6, thereby obtaining almost the same effects as those of the eleventh embodiment.

As described above, by supplying the high-frequency circuit 28 including an emitter follower circuit with the circuit current S600, which is roughly constant regardless of fluctuations in manufacturing processes, based on the present invention, it is possible to give a minimum required circuit current S600 without deteriorating characteristics even with fluctuations in manufacturing processes, thereby reducing dissipation power of the semiconductor integrated circuit 100.

The above description on each embodiment is just one example of implementation of the present invention; the present invention is not limited to these examples and can be developed to a variety of examples that can be easily configured by those skilled in the art by using technologies of the present invention.

The present invention can be utilized in a circuit current generation apparatus and method thereof, and a signal processing apparatus.

What is claimed is:

1. A signal processing apparatus comprising:
a mixer which is connected to an antenna circuit operable to receive a broadcast signal having a desired frequency in order to convert said broadcast signal into a predetermined intermediate-frequency signal or baseband signal;
a local oscillator operable to generate a signal having a frequency corresponding to said broadcast signal;
a buffer circuit operable to receive an output of said local oscillator to supply a local-oscillated signal to said mixer;
a frequency divider operable to divide a frequency of an output of said local oscillator;
a PLL circuit operable to operate in response to an output of said frequency divider so that said local oscillator output may have a predetermined frequency;
an intermediate-frequency signal processing section operable to receive an output of said mixer to process the intermediate-frequency signal or the baseband signal;
a reference current source operable to supply a constant current to said mixer, said local oscillator, said frequency divider, said PLL circuit, and said intermediate-frequency signal processing section;
a bias current detection section operable to detect a current value of said reference current source; and
a current control circuit operable to control current values of said mixer, said local oscillator, said frequency divider, said PLL circuit, and said intermediate-frequency signal processing section in accordance with an output of said bias current detection section.

2. The signal processing apparatus according to claim 1, comprising:
first and second current sources generated by a reference voltage source and a first resistor;
a second resistor which is connected to said first current source and has a structure equal to that of said first resistor; and
a third resistor which is connected to said second current source,
wherein a difference between voltages generated through said second and third resistors respectively is detected to detect a bias current value in said signal processing apparatus.

3. The signal processing apparatus according to claim 1, comprising:
a first resistor arranged between a first reference voltage source and a second reference voltage source; and
a second resistor through which a current equal to that flowing through said first resistor flows and of which one electrode is connected to said second reference voltage source,
wherein a difference between voltages generated at both ends of said first and second resistors respectively is detected to detect a bias current value in said signal processing apparatus.

4. The signal processing apparatus according to claim 1, wherein by current control by said current control circuit, if a bias current value is small, a current of an emitter follower is increased, and if the bias current value is large, the current of the emitter follower is decreased.

5. The signal processing apparatus according to claim 1, wherein by current control by said current control circuit, if a bias current value is small, a current of a source follower is increased, and if the bias current value is large, the current of the source follower is decreased.

6. The signal processing apparatus according to claim 1, wherein by current control by said current control circuit, if a bias current value is small, a current of said local oscillator is increased, and if the bias current value is large, the current of said local oscillator is decreased.

7. The signal processing apparatus according to claim 1, wherein by current control by said current control circuit, if a bias current value is small, a current of said mixer is increased, and if the bias current value is large, the current of said mixer is decreased.

8. The signal processing apparatus according to claim 1, wherein by current control by said current control circuit, if a bias current value is small, a current of a differential amplifier is increased, and if the bias current value is large, the current of the differential amplifier is decreased.

9. The signal processing apparatus according to claim 1, comprising a switch circuit at an output terminal of said current control circuit, wherein in accordance with an output of said current control circuit, said switch circuit conducts current control by switching currents of said mixer, said local oscillator, said frequency divider, said PLL circuit, and said intermediate-frequency signal processing section.

* * * * *